(12) United States Patent
Endo et al.

(10) Patent No.: US 8,043,483 B2
(45) Date of Patent: Oct. 25, 2011

(54) FILM FORMING METHOD BY SPUTTERING AND SPUTTERING APPARATUS THEREOF

(75) Inventors: Tetsuya Endo, Kokubunji (JP); Einstein Noel Abarra, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/684,359

(22) Filed: Jan. 8, 2010

(65) Prior Publication Data

US 2010/0133090 A1 Jun. 3, 2010

Related U.S. Application Data

(63) Continuation of application No. PCT/JP2007/066750, filed on Aug. 29, 2007.

(51) Int. Cl.
*C23C 14/35* (2006.01)

(52) U.S. Cl. ........... 204/192.2; 204/192.12; 204/192.13; 204/298.03; 204/298.11; 204/298.28; 204/298.29; 204/298.27

(58) Field of Classification Search ............. 204/192.12, 204/192.2, 298.11, 298.18, 298.27, 298.28, 204/298.29, 192.13, 298.03
See application file for complete search history.

(56) References Cited

U.S. PATENT DOCUMENTS

| | | | | |
|---|---|---|---|---|
| 5,962,080 A | * | 10/1999 | Tan et al. ................... | 427/529 |
| 6,086,727 A | * | 7/2000 | Pinarbasi ................ | 204/192.11 |
| 6,224,718 B1 | * | 5/2001 | Meyer ..................... | 204/192.12 |
| 6,460,243 B1 | | 10/2002 | Pinarbasi ................. | 29/603.14 |
| 6,818,961 B1 | | 11/2004 | Rizzo et al. .................... | 257/422 |
| 2004/0216992 A1 | * | 11/2004 | Ando et al. .............. | 204/192.12 |

FOREIGN PATENT DOCUMENTS

| | | |
|---|---|---|
| EP | 0 739 001 | 10/1996 |
| JP | 60-113330 | 6/1985 |
| JP | 2-221371 | 9/1990 |
| JP | 6-144990 | 5/1994 |
| JP | 8-296042 | 11/1996 |
| JP | 2001-195711 | 7/2001 |
| JP | 2005-213585 | 8/2005 |
| JP | 2008-019498 | 1/2008 |

* cited by examiner

*Primary Examiner* — Rodney McDonald
(74) *Attorney, Agent, or Firm* — Fitzpatrick, Cella, Harper & Scinto

(57) ABSTRACT

To provide a sputtering apparatus that enables oblique film forming by arranging a target and a substrate so as to allow sputtered particles emitted from the target to obliquely enter the substrate selectively, and can form a magnetic film having high uniaxial magnetic anisotropy uniformly and compactly. A sputtering apparatus includes a cathode having a sputtering target supporting surface, the cathode being provided with a rotation axis about which the sputtering target supporting surface rotates, and a stage having a substrate supporting surface, the stage being provided with a rotation axis about which the substrate supporting surface rotates, and the sputtering apparatus is constituted such that the sputtering target supporting surface and the substrate supporting surface face to each other, and are rotatable independently about respective rotation axes. Further, it is constituted such that a shield plate is arranged between the sputtering target supporting surface and the substrate supporting surface, and is rotatable independently from the cathode and the stage.

11 Claims, 28 Drawing Sheets

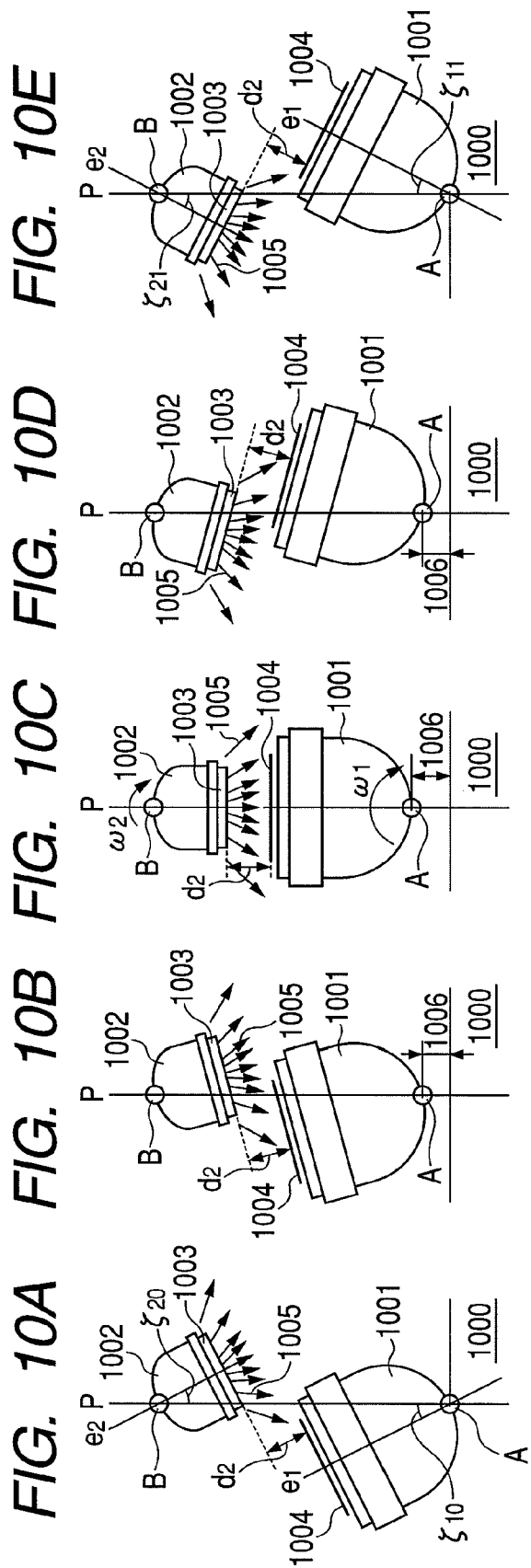

SUBSTRATE POSITION (X)

FILM FORMING METHOD BY SPUTTERING AND SPUTTERING APPARATUS THEREOF

CROSS-REFERENCES TO RELATED APPLICATIONS

This application is a continuation application of International Application No. PCT/JP2007/066750, filed on Aug. 29, 2007, the entire contents of which are incorporated by reference herein.

BACKGROUND OF THE INVENTION

1. Field of the Invention

The present invention relates to a film forming method by sputtering and a sputtering apparatus thereof.

2. Related Background Art

In these years, high frequency wave applications of an magnetic element have been enlarged in read/write heads, microinductors and micro transformer and the like, and a magnetic thin film having good high-frequency characteristics in a GHz band is needed. Accordingly, research and development relating to these are actively carried out. In order to use a magnetic thin film in a high-frequency band, it is necessary to increase an electrical resistance of the thin film, thereby reducing an eddy-current loss, and increasing a resonant frequency. Methods for increasing the resonant frequency include increasing the anisotropic magnetic field Hk or saturation magnetization Ms, but increasing Hk and Ms at the same time is generally difficult, and they are in a relation of trade-off. However, in recent years, by allowing sputtered particles to enter obliquely a substrate and to be oriented using a sputtering method or an ion beam method, it becomes possible to increase a uniaxial magnetic anisotropy based on the shape effect of crystals, and to increase Hk, too, while maintaining a high Ms.

The oblique film forming broadens on and on the application range, and, as a production method of performing obliquely oriented deposition by causing sputtered particles to enter a substrate obliquely, there is such a film forming structure of a substrate passing type that a substrate passes through the target foreside performing the sputtering operation (Patent Document 1). There is also a method which rotates and controls a substrate holder alone to grow a film obliquely (Patent Document 2).

[Patent Document 1] U.S. Pat. No. 6,818,961
[Patent Document 2] JP-A No. 6-144990

SUMMARY OF THE INVENTION

In order to increase the uniaxial magnetic anisotropy by the shape effect of crystals, it is necessary to orient uniformly flaky microcrystals that are perpendicular to the incident surface, and, in order to actualize this, the incident angle θ of sputtered particles shown in FIGS. 1 and 2 needs to be increased. FIG. 1 shows a state where sputtered particles 102 enter a substrate 101 being inclined by an angle θ relative to the vertical direction of the substrate. FIG. 2 is a diagram schematically showing the cross-sectional view of a film structure 202 grown by causing sputtered particles 201 to enter obliquely at an incident angle θ. The film structure 202 is formed from flaky microcrystals that are vertical to an incident surface X for sputtered particles 201. In order to actualize a film with such high orientation using the substrate passing type structure exemplified in FIG. 3 and described in Patent Document 1, the moving range of the substrate must be broadened. That is, when making the incident angle θ of sputtered particles greater and greater in order to increase the uniaxial magnetic anisotropy by the shape effect of crystals, as shown in FIG. 3, the moving range of a substrate 301 which is subjected to a sputtering treatment by a target 302 is inevitably broadened in the horizontal direction. As a result, the size of whole apparatus is increased. More specifically, in the passing type film forming structure as shown in FIG. 3, by extending the substrate moving range from a range of P2 to P3 to a range of P1 to P4 to increase the incident angle θ of sputtered particles, film properties are improved, but, on the other hand, the whole film forming apparatus is made very large. In the method of Patent Document 2, the distribution of film thickness and control of the incident direction of sputtered particles when a large film forming substrate is used are not considered. A problem of the present invention is to provide a compact and high quality apparatus for forming a uniaxial magnetic anisotropy film by keeping the incident angle θ of sputtered particles large.

A first aspect of the present invention is a sputtering apparatus comprising: a cathode including a sputtering target supporting surface, the cathode being provided with a rotation axis about which the sputtering target supporting surface rotates; and a stage including a substrate supporting surface, the stage being provided with a rotation axis about which the substrate supporting surface rotates, wherein the sputtering apparatus is constituted such that the sputtering target supporting surface and the substrate supporting surface face to each other and are rotatable independently about respective rotation axes.

In an embodiment, a first sputtering apparatus of the present invention is characterized by including a control device for controlling the rotation of at least one of the sputtering target supporting surface and the substrate supporting surface.

In an embodiment, the first sputtering apparatus of the present invention is characterized in that the stage includes a substrate placing table that is provided with a rotation axis perpendicular to the rotation axis of the stage, and that the substrate placing table is rotatable about the rotation axis thereof.

In an embodiment, the first sputtering apparatus of the present invention is characterized by including a control device for controlling the rotation of the substrate placing table.

A second aspect of the present invention is a sputtering apparatus comprising: a cathode including a sputtering target supporting surface, the cathode being provided with a rotation axis about which the sputtering target supporting surface rotates; a stage including a substrate supporting surface, the stage being provided with a rotation axis about which the substrate supporting surface rotates; and a shield plate provided with a rotation axis, wherein the sputtering apparatus is constituted such that the sputtering target supporting surface and the substrate supporting surface face to each other, the shield plate is arranged between the sputtering target supporting surface and the substrate supporting surface, and each of these is rotatable independently about its rotation axis.

In an embodiment, the second sputtering apparatus of the present invention is characterized by including a control device for controlling the rotation of at least one of the sputtering target supporting surface, the substrate supporting surface and the shield plate.

In an embodiment, the control device is characterized by controlling the rotation of the shield plate so as to shield sputtered particles that enter at a substrate incident angle smaller than a prescribed substrate incident angle.

In an embodiment, a second sputtering apparatus of the present invention is characterized in that the stage includes a substrate placing table provided with a rotation axis perpendicular to the rotation axis of the stage, and that the substrate placing table is rotatable about the rotation axis thereof. The substrate placed on the substrate placing stage can rotate about two rotation axes to enable an oriented film having high uniformity to be formed while further narrowing the moving range of the target and stage.

In an embodiment, the second sputtering apparatus of the present invention is characterized by including a control device for controlling the rotation of the substrate placing table.

By rotating the target and/or stage concurrently with the sputtering treatment, it becomes possible to make the substrate incident angle large even in a narrow and limited space, and to form uniformly a film having good orientation characteristics. Further, the shield plate can rotate independently from the cathode and the stage, which is advantageous to finely adjust the distribution of film thickness and to enhance the selectivity for the incident angle of sputtered particles. Furthermore, the substrate placed on the substrate placing stage can rotate about two rotation axes, to enable an oriented film having high uniformity to be formed while further narrowing the moving range of the target and stage.

BRIEF DESCRIPTION OF THE DRAWINGS

FIG. 10A is a diagram showing a state at the start of sputtering in an embodiment of the first sputtering apparatus according to the present invention.

FIGS. 10B to 10D are diagrams showing states in the middle of sputtering in an embodiment of the first sputtering apparatus according to the present invention.

FIG. 10E is a diagram showing a state at stoppage of sputtering in an embodiment of the first sputtering apparatus according to the present invention.

401: Stage
402: Cathode
403: Target
404: Substrate
405: Sputtered particles
A: Rotation axis A
B: Rotation axis B

DESCRIPTION OF THE PREFERRED EMBODIMENTS

Figure 4A:
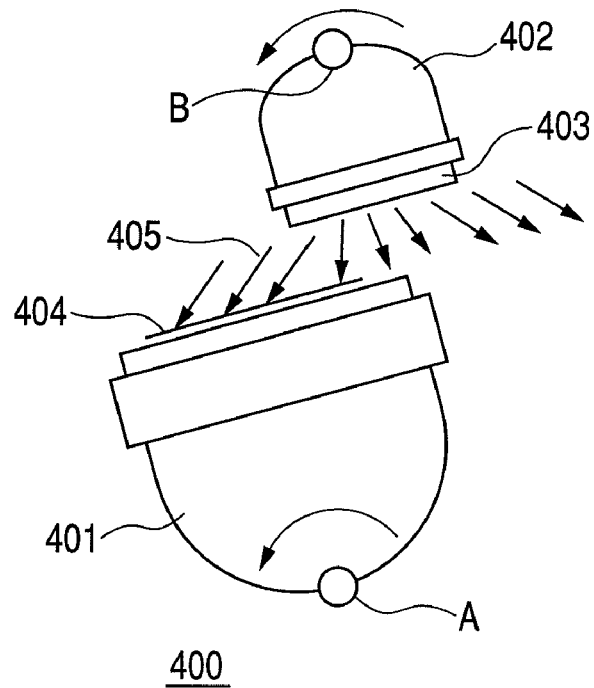
FIG. 4A is a side view of a first sputtering apparatus according to the present invention.
Figure 4B:
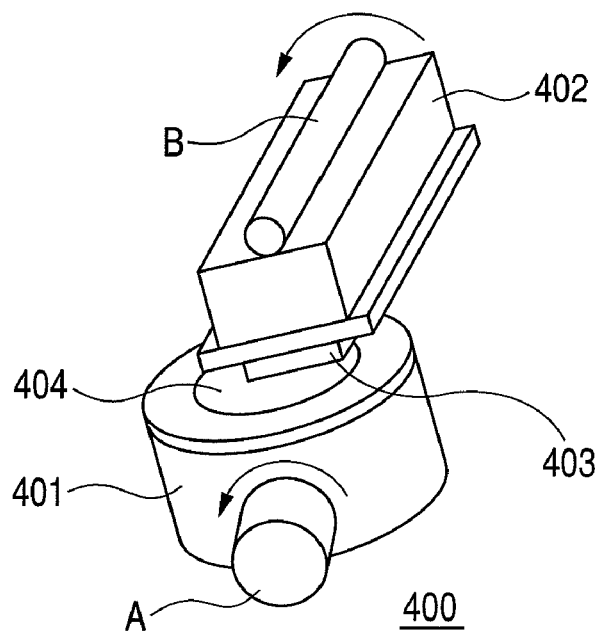
FIG. 4B is a perspective view of the first sputtering apparatus according to the present invention.

FIG. 4A is a side view of a first sputtering apparatus 400 according to the present invention. FIG. 4B is a perspective view of the first sputtering apparatus 400 according to the present invention. The sputtering apparatus 400 includes a stage 401 for placing a substrate 404, and a cathode 402 for supporting a target 403, wherein a target supporting surface of the cathode 402 and a substrate supporting surface of the stage 401 are arranged so as to face to each other. The stage 401 and the cathode 402 are provided with a rotation axis A and a rotation axis B, respectively, and the stage 401 and the cathode 402 are constituted so as to rotate about the rotation axis A and the rotation axis B, respectively, at an arbitrary angle. For example, the stage 401 and the cathode 402 may be rotated using such a rotation means as a motor, and the rotation means may be controlled by a control device. The rotation axis A and the rotation axis B are arranged in parallel with each other, and the target 403 is supported by the cathode 402 so as to become parallel to the rotation axis B. The target 403, which is supported by the cathode 402 rotatable about the rotation axis B at an arbitrary angle, can deposit sputtered particles 405 on the substrate 404 by colliding ions in plasma to the surface of the target 403 in each case of standing still and being rotated. The substrate 404, which is subjected to a film forming treatment by the target 403, is placed on the stage 401 that is rotatable about the rotation axis A at an arbitrary angle. The substrate supporting surface of the stage 401 and the target supporting surface of the cathode 402 are constituted so as to be independently rotatable about the rotation axis A and the rotation axis B, respectively.

Figure 5A:
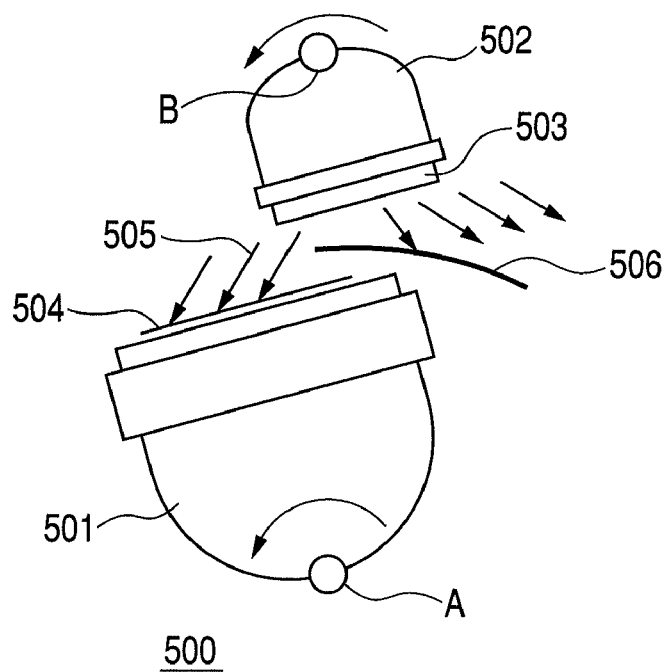
FIG. 5A is a side view of a second sputtering apparatus according to the present invention.
Figure 5B:
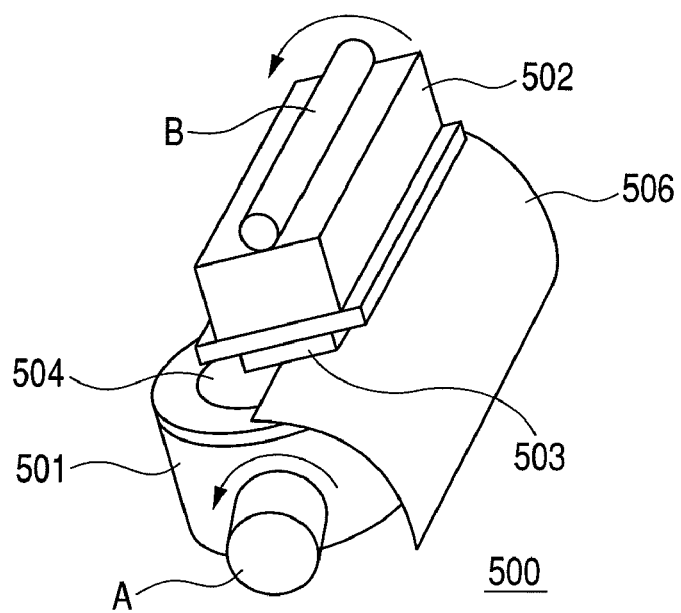
FIG. 5B is a perspective view of the second sputtering apparatus according to the present invention.

FIG. 5A is a side view of a second sputtering apparatus 500 according to the present invention. FIG. 5B is a perspective view of the second sputtering apparatus 500 according to the present invention. In FIGS. 5A and 5B, the sputtering apparatus 500 includes a stage 501 for placing a substrate 504, a cathode 502 for supporting a target 503, and a shield plate 506, wherein a target supporting surface of the cathode 502 and a substrate supporting surface of the stage 501 are arranged so as to face to each other. The stage 501 and the cathode 502 are provided with the rotation axis A and the rotation axis B, respectively, and the stage 501 and the cathode 502 are constituted so as to rotate about the rotation axis A and the rotation axis B, respectively, at an arbitrary angle. For example, the stage 501 and the cathode 502 may be rotated using such a rotation means as a motor, and the rotation means may be controlled by a control device. The rotation axis A and the rotation axis B are arranged in parallel with each other, and the target 503 is supported by the cathode 502 so as to become parallel with the rotation axis B. The target 503 supported by the cathode 502 that is rotatable about the rotation axis B at an arbitrary angle can deposit sputtered particles 505 on the substrate 504 by colliding ions in plasma to the surface of the target 503 in each case of standing still and being rotated. The substrate 504, which is subjected to a film forming treatment by the target 503, is placed on the stage 501 that is rotatable about the rotation axis A at an arbitrary angle. The substrate supporting surface of the stage 501 and the target supporting surface of the cathode 502 are constituted so as to be independently rotatable about the rotation axis A and the rotation axis B, respectively. Further, between the target 503 and the stage 501, a shield plate 506 is provided. The shield plate 506 has a means to rotate about either the rotation axis A or the rotation axis B at an arbitrary angle, and functions for finely adjusting the thickness distribution of a film to be deposited, and enhancing the selectivity of the incident angle of sputtered particles. The shield plate 506 can rotate about the rotation axis A or the rotation axis B by an arbitrary method, and, in the present embodiment, it is constituted so as to be rotatable about the rotation axis A. The shield plate 506 may be controlled by a control device so as to rotationally move independently from the cathode 503 or the stage 501. The difference from FIGS. 4A and 4B exists in that the shield plate 506 is provided between the target 503 and the stage 501.

Figure 6A:
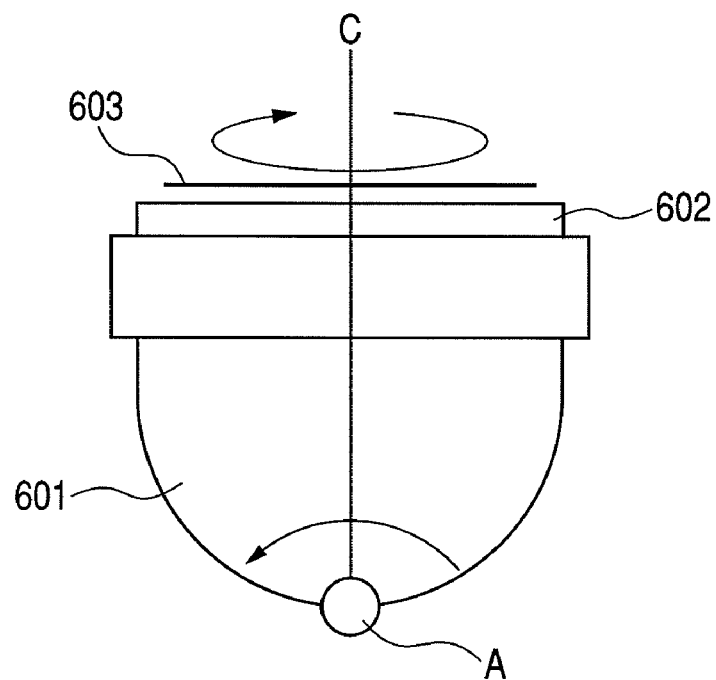
FIG. 6A is a side view of a substrate placing stage according to the present invention.
Figure 6B:
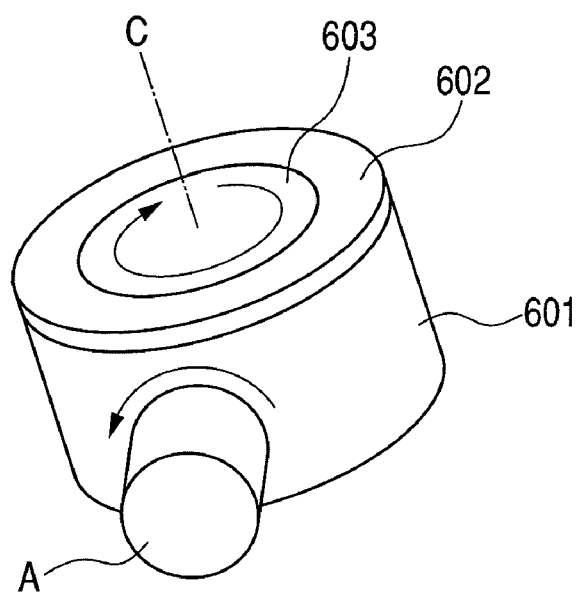
FIG. 6B is a perspective view of the substrate placing stage according to the present invention.

FIG. 6A is a side view of a stage 601 utilizable as the stage of the sputtering apparatus in FIGS. 4A and 5A. The stage 601 has a substrate placing table 602, and, on the substrate placing table 602, a substrate 603 is placed. FIG. 6B is a perspective view of the stage 601 according to the present invention. The stage 601 is constituted so as to be rotatable about the rotation axis A, as with FIGS. 4 and 5. The substrate placing table 602 of the stage 601 is constituted so as to be rotatable about a rotation axis C that is perpendicular to the rotation axis A and passes through the center of the substrate 603, and the substrate 603 may be rotated about the rotation axis C. The substrate placing table 602 may be rotated using such a rotation means as a motor, and the rotation means may be controlled by a control device.

Figure 7A:
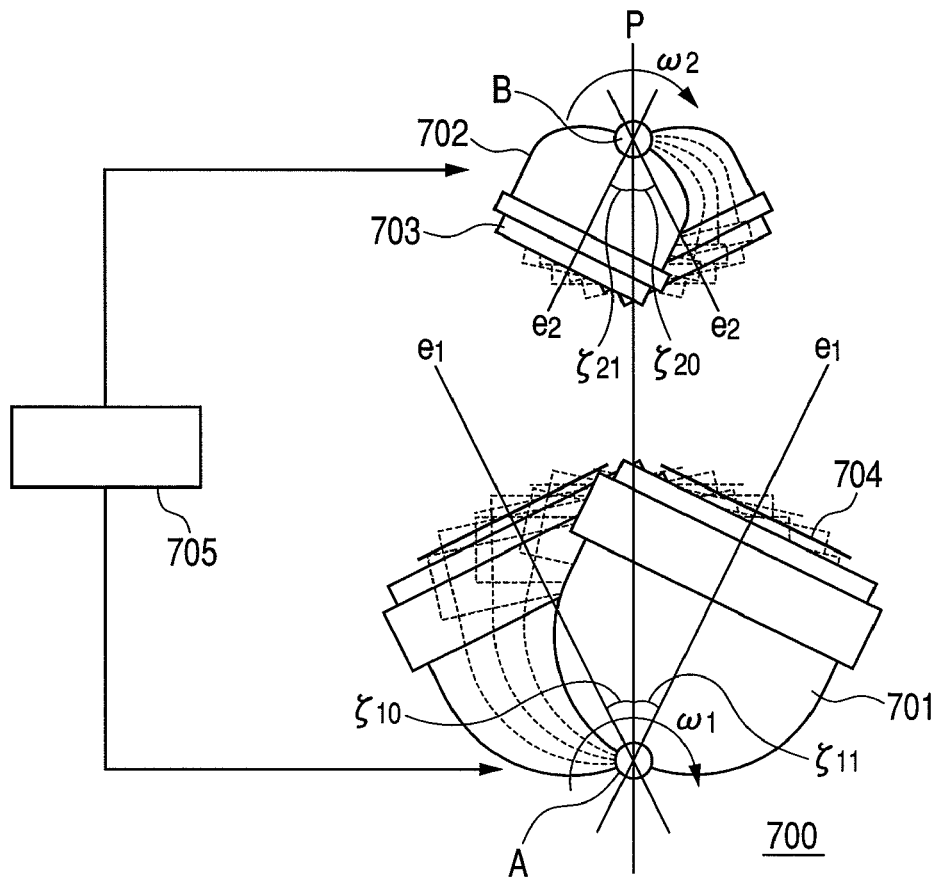
FIG. 7A is a diagram showing a film forming technique using the first sputtering apparatus according to the present invention.

FIG. 7A is a diagram showing a film forming technique using the first sputtering apparatus according to the present invention shown in FIGS. 4A and 4B. A sputtering apparatus 700 includes a stage 701 for placing a substrate 704, and a cathode 702 for supporting a target 703. The stage 701 and the cathode 702 are provided with the rotation axis A and the rotation axis B, respectively, and the stage 701 and the cathode 702 are constituted so as to rotate about the rotation axis A and the rotation axis B, respectively, at an arbitrary angle from a reference plane P. Here, the reference plane P means a flat plane that passes across the rotation axis A and the rotation axis B and extends in the direction of respective rotation axes. The rotation axis A and the rotation axis B are arranged in parallel with each other, and the target 703 is supported by the cathode 702 so as to become parallel to the rotation axis B. The target 703, which is supported by the cathode 702 that is rotatable about the rotation axis B, deposits sputtered particles on the substrate 704 by colliding ions in plasma to the surface of the target 703. The substrate 704 subjected to a film forming treatment by the target 703 is placed on the stage 701 that is rotatable about the rotation axis A.

The sputtering film forming process starts from a position where the cathode 702 inclines about the rotation axis B by an angle $\xi_{20}$ from the reference plane P to the right direction and the stage 701 inclines about the rotation axis A by an angle $\xi_{10}$ from the reference plane P to the left direction, and the cathode 702 starts to rotate at an angular velocity $\omega_2$, and the stage 701 starts to rotate at an angular velocity $\omega_1$ in the same rotation direction. At the time point when the cathode 702 arrives at a position inclining about the rotation axis B by an angle $\xi_{21}$ from the reference plane P to the left direction and the stage 701 arrives at a position inclining about the rotation axis A by an angle $\xi_{11}$ from the reference plane P to the right direction, both the cathode 702 and the stage 701 are stopped and the sputtering process also terminates. A series of rotational movement of the cathode 702 and the stage 701 is actualized by controlling such a rotation means as a motor by a control device 705. The control device 705 functions so as to control respective components of the sputtering apparatus of the present invention, although it is not clearly shown in other diagrams.

The rotation angles $\xi_{20}$ and $\xi_{21}$ of the cathode 702 from the reference plane P are defined as angles formed between the reference plane P and the centerline $e_2$ of the cathode 702. In the same way, the rotation angles $\xi_{10}$ and $\xi_{11}$ of the stage 701 from the reference plane P are defined as angles formed between the reference plane P and the centerline $e_1$ of the stage 701. In embodiments below, too, description will be given on the basis of the above definition.

Figure 7B:
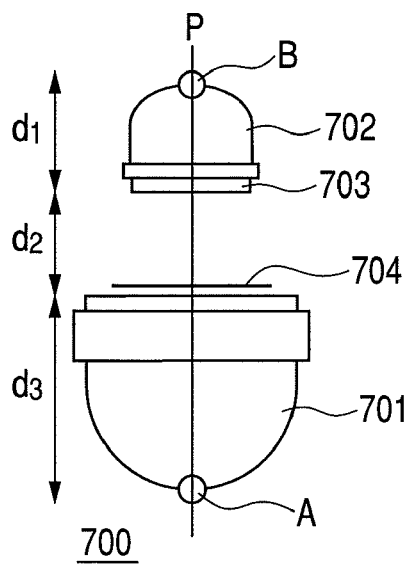
FIG. 7B is a side view of the first sputtering apparatus according to the present invention.

FIG. 7B is a diagram showing a state in which the positional relationship among respective components of the first sputtering apparatus according to the present invention shown in FIGS. 4A and 4B is clearer. FIG. 7B shows an arrangement state in which the target 703 and the substrate 704 face straight in front of each other, wherein the centerlines $e_1$ and $e_2$ are on the reference plane P. When the cathode 702 and the stage 701 are positioned straight in front of each other, the surface of the target 703 supported by the cathode 702 and the surface of the substrate 704 placed on the stage 701 are parallel with each other, and perpendicular to the reference plane P. $d_1$ shows the distance between the rotation axis B and the surface of the target 703, $d_2$ shows the distance between the surface of the target 703 and the surface of the substrate 704, and $d_3$ shows the distance between the rotation axis A and the surface of the substrate 704. The distance $d_2$ may change in accordance with the rotation angle and the rotation velocity of the cathode 702 and the stage 701.

Figure 7C:
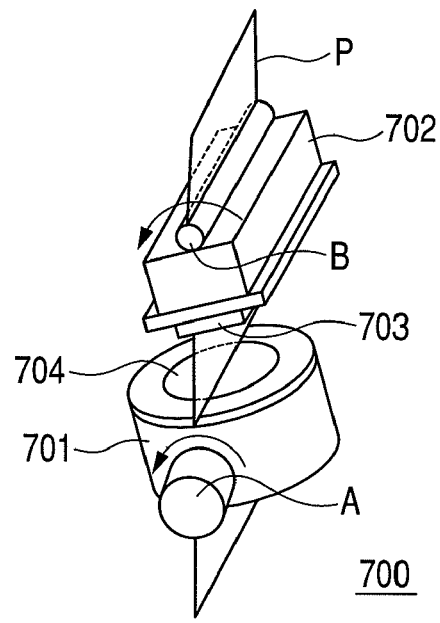
FIG. 7C is a perspective view of the first sputtering apparatus according to the present invention.

FIG. 7C is a perspective view of the first sputtering apparatus according to the present invention shown in FIGS. 4A and 4B.

Figure 8A:
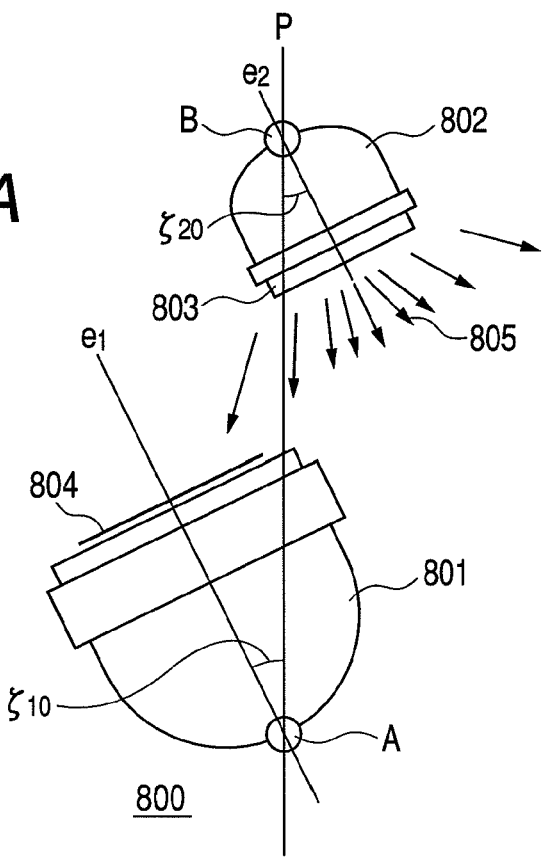
FIG. 8A is a diagram showing a state at the start of sputtering in an embodiment of the first sputtering apparatus according to the present invention.
Figure 8B:
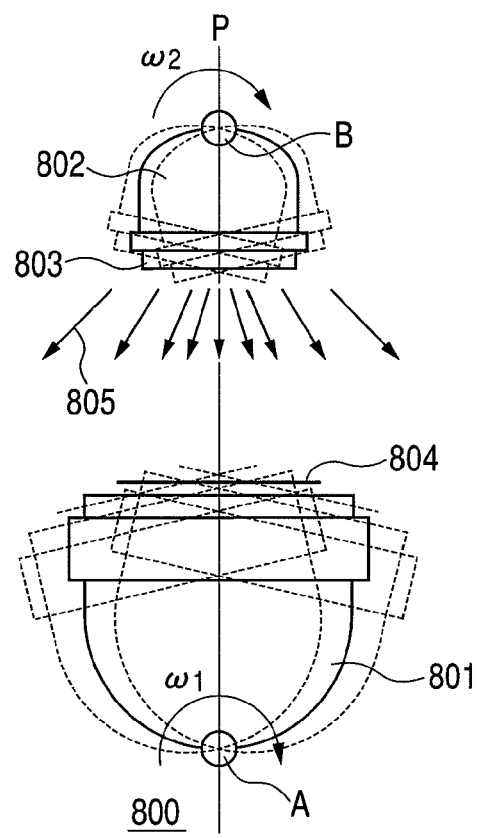
FIG. 8B is a diagram showing a state in the middle of sputtering in an embodiment of the first sputtering apparatus according to the present invention.
Figure 8C:
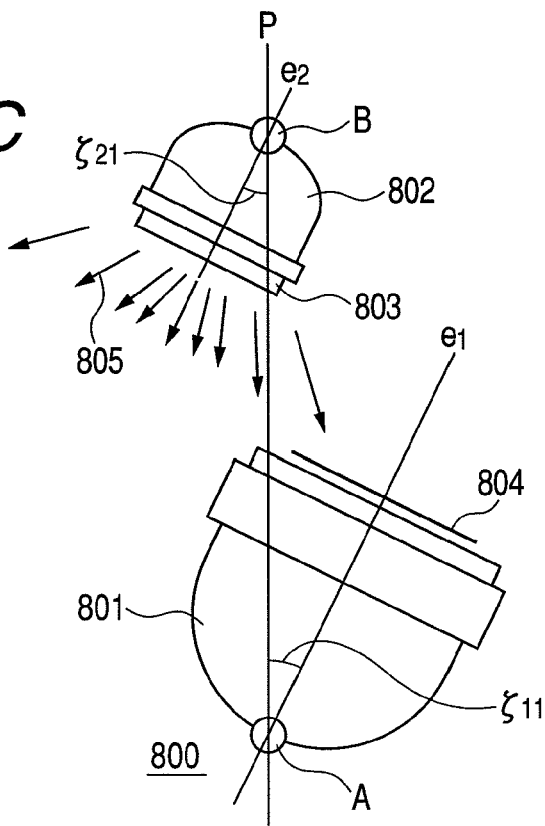
FIG. 8C is a diagram showing a state at the stoppage of sputtering in an embodiment of the first sputtering apparatus according to the present invention.

FIGS. 8A to 8C are diagrams showing an embodiment of the first sputtering apparatus 400 according to the present invention shown in FIGS. 4A and 4B. The basic constitution of a sputtering apparatus 800 is the same as that of the sputtering apparatus 700 shown in FIGS. 7A to 7C. In the embodiment, sputtered particles 805 are deposited on a substrate 804 placed on a stage 801, while setting an angle at rotation start and an angle at rotation end to $\xi_{10}=\xi_{11}$ and $\xi_{20}=\xi_{21}$, and rotating a cathode 802 and a stage 801 about respective rotation axes so as to satisfy the relation of angular velocities $\omega_2/\omega_1=\xi_{10}/\xi_{20}$ that enables centerlines $e_2$ and $e_1$ of the cathode 802 and the stage 801 to pass across the reference plane P at the same time.

FIG. 8A shows a situation in which a sputtering film forming process starts from a position where the cathode 802 inclines about the rotation axis B from the reference plane P to the right direction by the angle $\xi_{20}$ and the stage 801 inclines about the rotation axis A from the reference plane P to the left direction by the angle $\xi_{10}$, and the cathode 802 starts to rotate at the angular velocity $\omega_2$ and the stage 801 starts to rotate at the angular velocity $\omega_1$ in the same rotation direction.

FIG. 8B shows a situation in which the centerlines $e_1$ and $e_2$ of the stage 801 and the cathode 802 pass across the reference plane P at the same time. The cathode 802 rotates at the angular velocity $\omega_2$, and the stage 801 rotates at the angular velocity $\omega_1$, in the same rotation direction. In the situation shown in FIG. 8B, as compared with those in FIGS. 8A and 8C, the incident angle of sputtered particles 805 emitted from the target 803 to the substrate 804 becomes small.

FIG. 8C shows a situation in which, when the cathode 802 arrives at a position inclined about the rotation axis B by the angle $\xi_{21}$ from the reference plane P to the left direction and the stage 801 arrives at a position inclined about the rotation axis A by the angle $\xi_{11}$ from the reference plane P to the right direction, both stop and the sputtering process terminates.

Figure 9A:
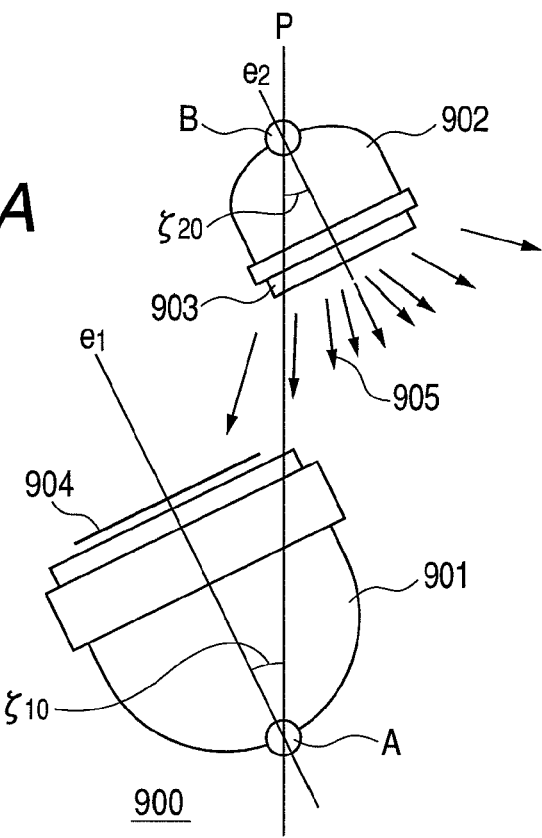
FIG. 9A is a diagram showing a state at the start of sputtering in an embodiment of the first sputtering apparatus according to the present invention.
Figure 9B:
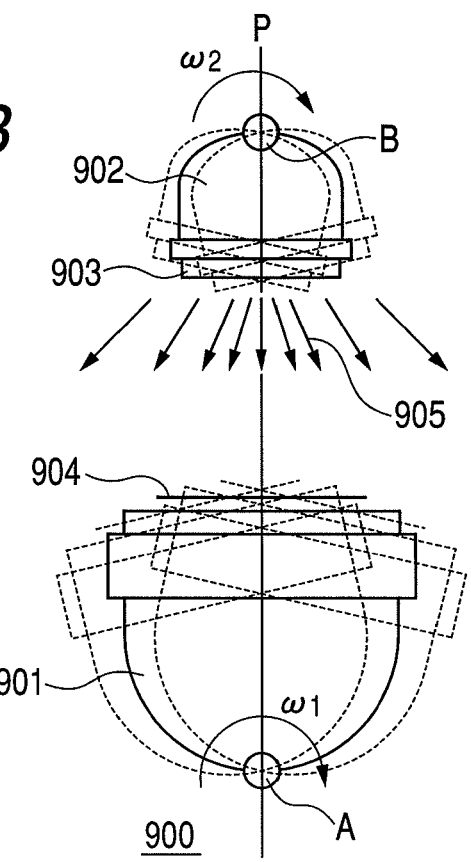
FIG. 9B is a diagram showing a state in the middle of sputtering in an embodiment of the first sputtering apparatus according to the present invention.
Figure 9C:
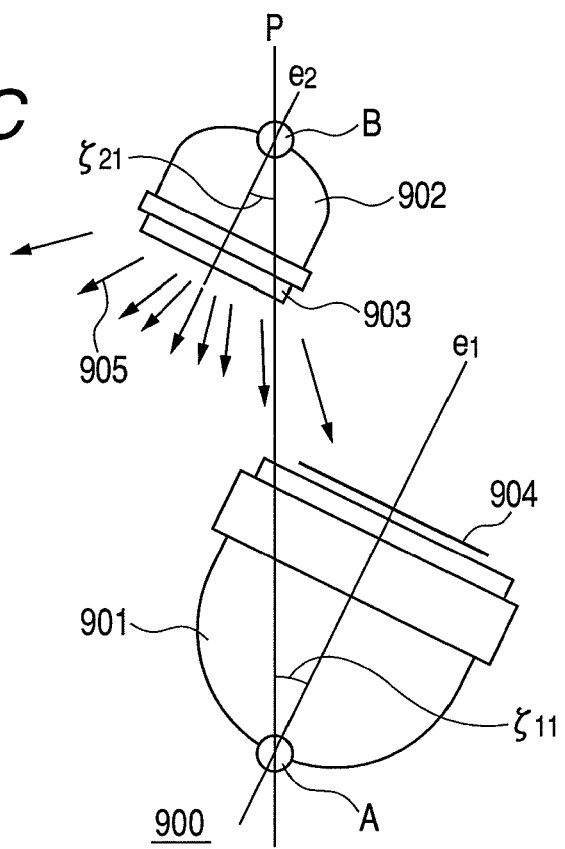
FIG. 9C is a diagram showing a state at the end of sputtering in an embodiment of the first sputtering apparatus according to the present invention.

FIGS. 9A to 9C are diagrams showing an embodiment of the first sputtering apparatus according to the present invention shown in FIGS. 4A and 4B. The basic constitution of a sputtering apparatus 900 is the same as that of the sputtering apparatus 700 shown in FIGS. 7A to 7C. In the embodiment, while setting the angle at rotation start and the angle at rotation end to $\xi_{10}=\xi_{11}=\xi_{20}=\xi_{21}$, and the angular velocity of the cathode 902 and the stage 901 to $\omega_1=\omega_2$, oblique deposition is carried out. Differing from the embodiment shown in FIGS. 8A to 8C, in the embodiment, the surface of the target 903 and the surface of the substrate 904 are in a completely parallel state, thus making it possible to actualize in a limited space a function equivalent to the substrate transport and deposition mechanism described in Patent Document 1.

FIG. 9A shows a situation in which a sputtering film forming process is started from a position where the cathode 902 inclines about the rotation axis B from reference plane P to the right direction by the angle $\xi_{20}$ and the stage 901 inclines about the rotation axis A from the reference plane P to the left direction by the angle $\xi_{10}$, and the cathode 902 starts to rotate at the angular velocity $\omega_2$ and the stage 901 starts to rotate at the angular velocity $\omega_1$ in the same rotation direction.

FIG. 9B shows a situation in which centerlines $e_1$ and $e_2$ of the cathode 902 and the stage 901 pass across the reference plane P at the same time. The cathode 902 rotates at the angular velocity $\omega_2$, and the stage 901 rotates at the angular velocity $\omega_1$, in the same rotation direction. In the situation shown in FIG. 9B, as compared with that in FIGS. 9A and 9C, the incident angle of sputtered particles 905 emitted from the target 903 to the substrate 904 becomes small.

FIG. 9C shows a situation in which, when the cathode 902 arrives at a position inclined about the rotation axis B from the reference plane P to the left direction by the angle $\xi_{21}$ and the stage 901 arrives at a position inclined about the rotation axis A from the reference plane P to the right direction by the angle $\xi_{11}$, both the cathode 902 and the stage 901 stop and the sputtering process terminates. As described above, in the embodiment, in any state shown in FIGS. 9A to 9C, the surface of the target 903 and the surface of the substrate 904 maintain the parallel state.

In FIGS. 9A to 9C, when setting the angle at rotation start and the angle at rotation end to $\xi_{10}=\xi_{11}=\xi_{20}=\xi_{21}=25°$, the distance between the rotation axis A and the surface of the target 903 to 160 mm, the distance between the target 903 and the substrate 904 to 80 mm, the distance between the rotation axis A and the surface of the substrate 904 to 300 mm, the target material to NiFe, the target size to 130 mm×600 mm×5 mm, and the substrate size to 200 mm in diameter, a film thickness distribution ((range/average)×100%) of 3% was obtained. Meanwhile, when denoting the largest film thickness by $D_{max}$ and the smallest film thickness by $D_{min}$ among the film thicknesses on the substrate after film formation, the range is $D_{max}-D_{min}$ and the average is $(D_{max}+D_{min})/2$, which are applied hereinafter, too.

According to the constitution of FIGS. 9A to 9C, during the rotation of the cathode 902 and the stage 901, the distance $d_2$ between the target 903 and the substrate 904 varies. Accordingly, it is also possible to provide a position adjustment mechanism (not shown) for a stage 1001 as shown in FIGS. 10A to 10E to adjust a T/S (target/stage) adjustment distance 1006, thereby making the distance $d_2$ between a target 1003 and a substrate 1004 constant at any time. Meanwhile, the basic constitution of a sputtering apparatus 1000 is the same as that of the sputtering apparatus 700 shown in FIGS. 7A to 7C. In the embodiment, as with FIGS. 9A to 9C, the angle at rotation start and the angle at rotation end are set to $\xi_{10}=\xi_{11}=\xi_{20}=\xi_{21}$, and the angular velocity of the cathode 1002 and the stage 1001 are set to $\omega_1=\omega_2$, and the surface of the target 1003 and the surface of the substrate 1004 are constituted so as to become in completely parallel state.

FIG. 10A shows a situation in which a sputtering film forming process starts from a position where the cathode 1002 inclines about the rotation axis B from the reference plane P to the right direction by the angle $\xi_{20}$, and the stage 1001 inclines about the rotation axis A from the reference plane P to the left direction by the angle $\xi_{10}$, and the cathode 1002 starts to rotate at the angular velocity $\omega_2$ and the stage 1001 starts to rotate at the angular velocity $\omega_1$ in the same rotation direction. The target 1003 deposits sputtered particles 1005 on the substrate 1004.

FIGS. 10B to 10D represent the motion of a position adjustment mechanism (not shown), in addition to the motion of the cathode 1002 and the stage 1001 during sputtering. The cathode 1002 rotates at the angular velocity $\omega_2$, and the stage 1001 rotates at the angular velocity $\omega_1$, in the same direction. A situation, in which a position adjustment mechanism (not shown) controls the T/S adjustment distance 1006 in a vertical direction of the stage 1001 in order to keep the distance $d_2$ between the target 1003 and the substrate 1004 during sputtering performed concurrently with the rotation of the stage 1001 and the cathode 1002, is shown.

FIG. 10E shows a situation in which, at the time point when the cathode 1002 arrives at a position inclining about the rotation axis B by an angle $\xi_{21}$ from the reference plane P and the stage 1001 arrives at a position inclining about the rotation axis A by an angle $\xi_{11}$ from the reference plane P, both the cathode 1002 and the stage 1001 are stopped and the sputtering process terminates.

Figure 11A:
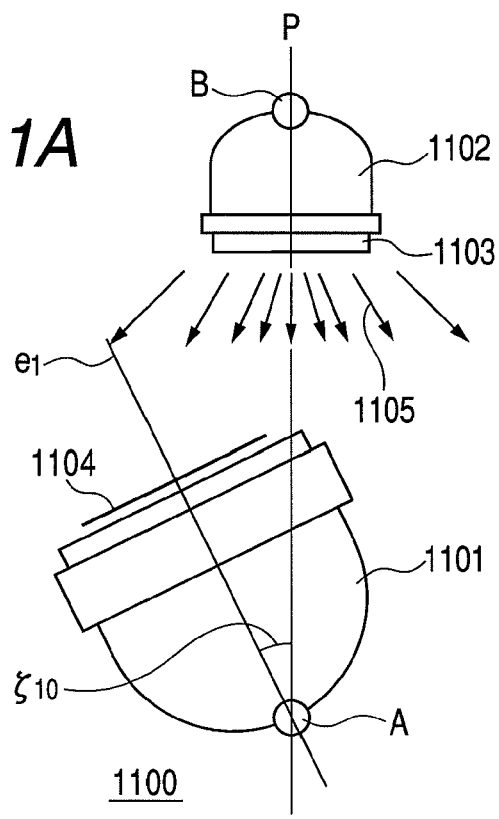
FIG. 11A is a diagram showing a state at the start of sputtering in an embodiment of the first sputtering apparatus according to the present invention.
Figure 11B:
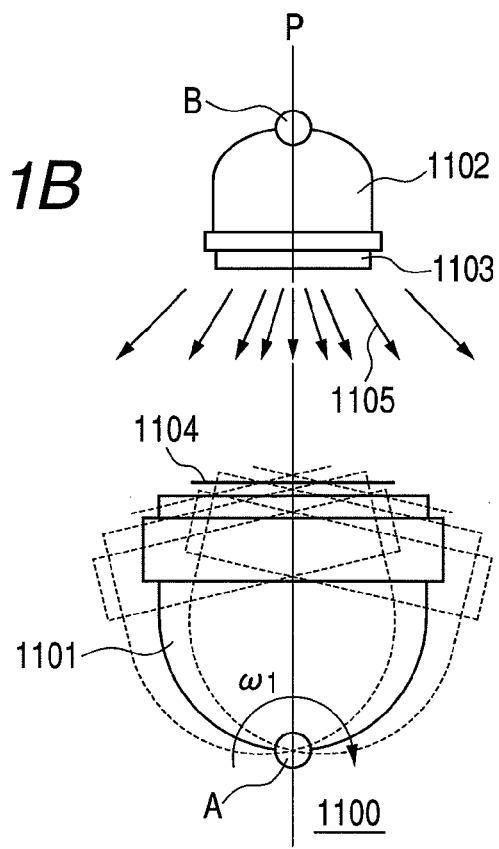
FIG. 11B is a diagram showing a state in the middle of sputtering in an embodiment of the first sputtering apparatus according to the present invention.
Figure 11C:
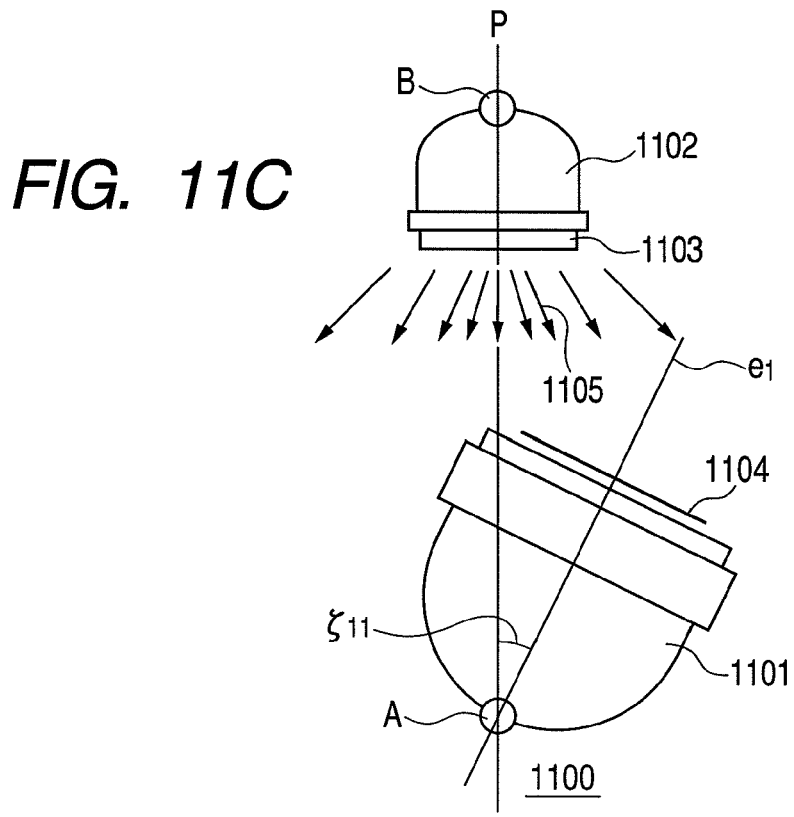
FIG. 11C is a diagram showing a state at the end of sputtering in an embodiment of the first sputtering apparatus according to the present invention.

FIGS. 11A to 11C are diagrams showing an embodiment of the first sputtering apparatus according to the present invention shown in FIGS. 4A and 4B. The basic constitution of a sputtering apparatus 1100 is the same as that of the sputtering apparatus 700 shown in FIGS. 7A to 7C. In the embodiment, a state, in which oblique incidence sputtering film forming is carried out on a substrate 1104 while setting the angle at the rotation start and the angle at the rotation end to $\xi_{20}=\xi_{21}=0$ and $\xi_{10}=\xi_{11}\neq0$, and rotating a stage 1101 alone, is shown.

FIG. 11A shows a state of the stage 1101 and a cathode 1102 when the stage 1101 starts to rotate and the sputtering by a target 1103 starts, wherein the angle between the reference plane P and the centerline $e_1$ of the stage 1101 is set to $\xi_{10}$. In the embodiment, the cathode 1102 does not rotate, but the stage 1101 alone rotates at the angular velocity $\omega_1$. The target 1103 deposits sputtered particles 1105 on the substrate 1104.

FIG. 11B shows a state of the stage 1101 and the cathode 1102, the stage 1101 being rotating, and a state when the centerline $e_1$ of the stage 1101 passes across the centerline $e_2$ of the cathode 1102 and the reference plane P that overlap with each other. The stage 1101 rotates at the angular velocity $\omega_1$.

FIG. 11C shows a state in which the stage 1102 stops and the sputtering process terminates, wherein the angle between the reference plane P and the centerline $e_1$ of the stage 1101 is $\xi_{11}$.

Figure 12A:
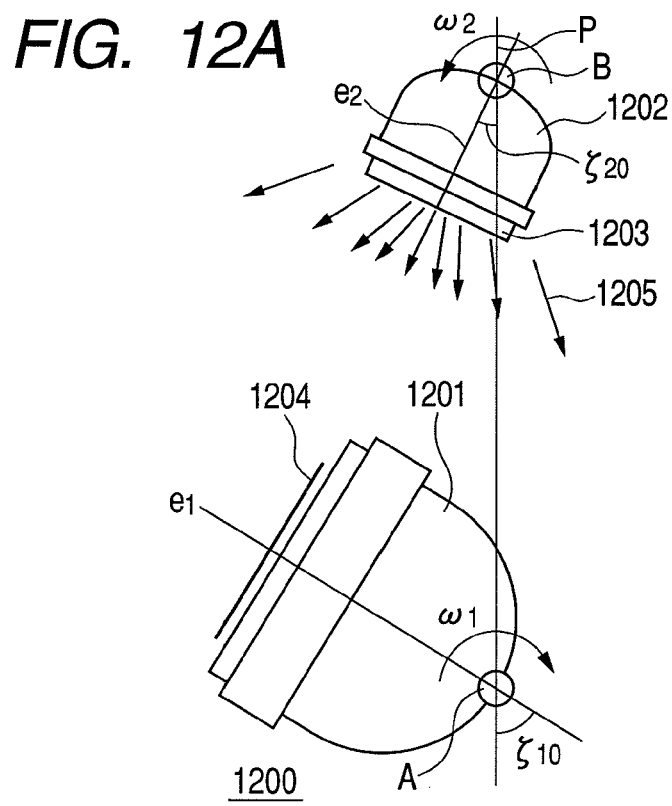
FIG. 12A is a diagram showing a state at the start of sputtering in an embodiment of the first sputtering apparatus according to the present invention.
Figure 12B:
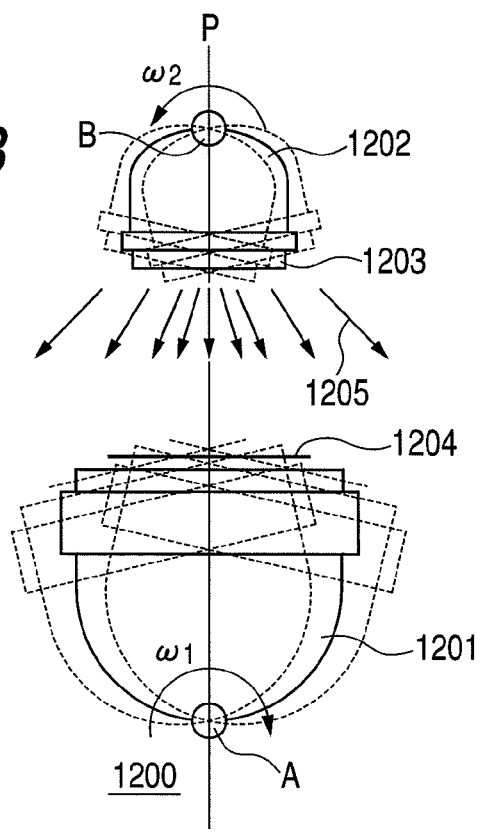
FIG. 12B is a diagram showing a state in the middle of sputtering in an embodiment of the first sputtering apparatus according to the present invention.
Figure 12C:
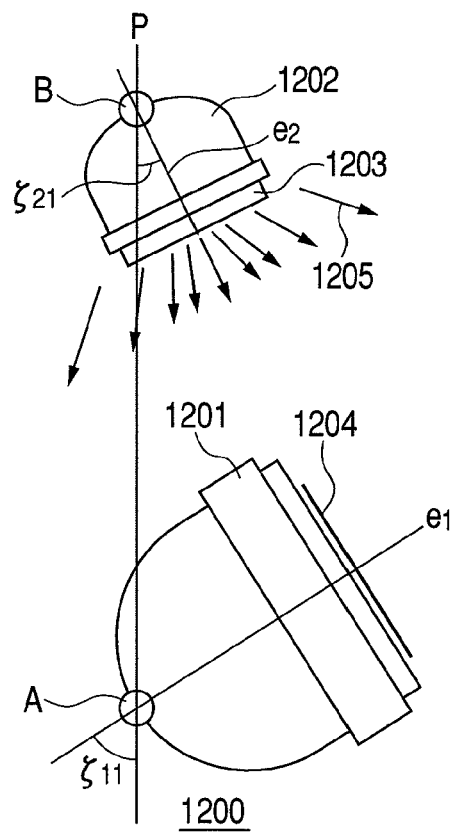
FIG. 12C is a diagram showing a state at the end of sputtering in an embodiment of the first sputtering apparatus according to the present invention.

FIGS. 12A to 12C are diagrams that represent an embodiment to which the first sputtering apparatus according to the present invention shown in FIGS. 4A and 4B is applicable. The basic structure of a sputtering apparatus 1200 is the same as that of the sputtering apparatus 700 shown in FIGS. 7A to 7C. In the embodiment, the oblique film forming was carried out on a substrate 1204 by setting the angle at the rotation start and the angle at the rotation end to $\xi_{10}=\xi_{11}\neq0$ and $\xi_{20}=\xi_{21}\neq0$, and setting the angular velocity to $\omega_2/\omega_1=\xi_{20}/\xi_{10}$, while rotating a stage 1201 and a cathode 1202 in inclined angles, respectively, in the same direction (in the embodiment, to the left direction of the reference plane P) relative to the reference plane P. Appropriate adjustment of the arranged position of respective components at the rotation start, the angle at the rotation start, the angle at the rotation end, rotation velocity and rotation direction makes it possible to increase the obliquely incident component of sputtered particles 1205 to be deposited on the substrate 1204.

FIG. 12A shows a situation in which a sputtering film forming process is started when the cathode 1202 inclines about the rotation axis B by an angle $\xi_{20}$ from the reference plane P to the left direction and the stage 1201 inclines about the rotation axis A by an angle $\xi_{10}$ from the reference plane P to the left direction, and the cathode 1202 starts rotation at the angular velocity $\omega_2$ and the stage 1201 starts rotation at the angular velocity $\omega_1$, in rotation directions different from each other. As is clear from FIG. 12A, by setting the angle at the rotation start $\xi_{10}$ and $\xi_{20}$ of the stage 1201 and the cathode 1202 so as to give a state that an angle formed between the surface of the target 1203 supported by the cathode 1202 and the surface of the substrate 1204 placed on the stage 1201 is approximately 90°, it is possible to increase the oblique incidence component of sputtered particles 1205.

FIG. 12B shows a state of the stage 1201 and the cathode 1202 during rotation motion, which shows a situation in which centerlines $e_1$ and $e_2$ of the cathode 1202 and the stage 1201 pass across the reference plane P at the same time. The cathode 1202 rotates at the angular velocity $\omega_2$, and the stage 1201 rotates at the angular velocity $\omega_1$, in rotation directions different from each other.

FIG. 12C shows a situation in which both the cathode 1202 and the stage 1201 stop when the cathode 1202 arrives at a position inclining about the rotation axis B by the angle $\xi_{21}$ from the reference plane P, and the stage 1201 arrives at a position inclining about the rotation axis A by the angle $\xi_{11}$ from the reference plane P, and the sputtering process terminates. As is clear from FIG. 12C, by setting the angles at the rotation start $\xi_{11}$ and $\xi_{21}$ of the stage 1201 and the cathode 1202 respectively so as to give a state that an angle formed between the surface of the target 1203 supported by the cathode 1202 and the surface of the substrate 1204 placed on the stage 1201 is approximately 90°, it is possible to increase the oblique incidence component of sputtered particles 1205.

Figure 13A:
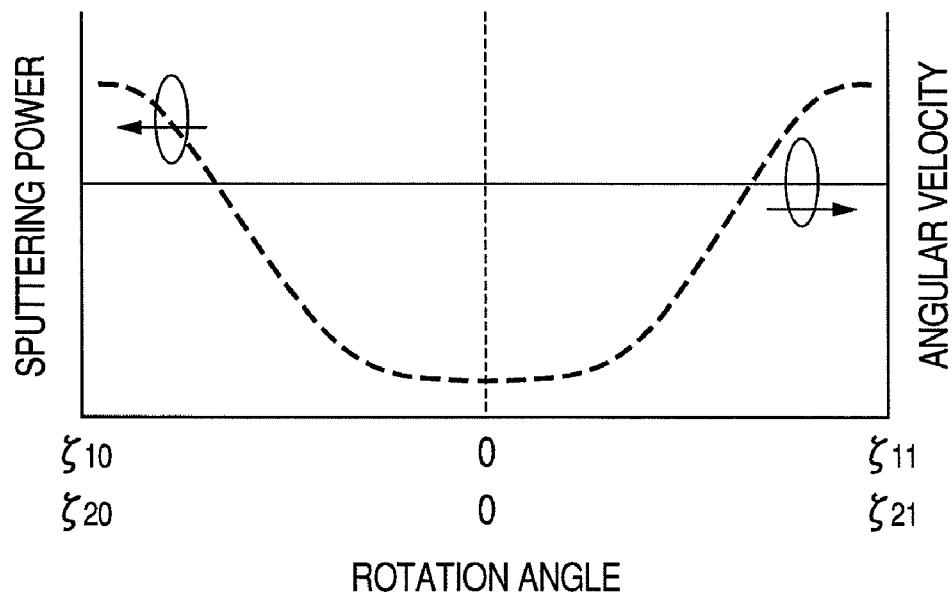
FIG. 13A is a graph showing the change of sputtering power and angular velocity relative to the rotation angle of the stage and the cathode.
Figure 13B:
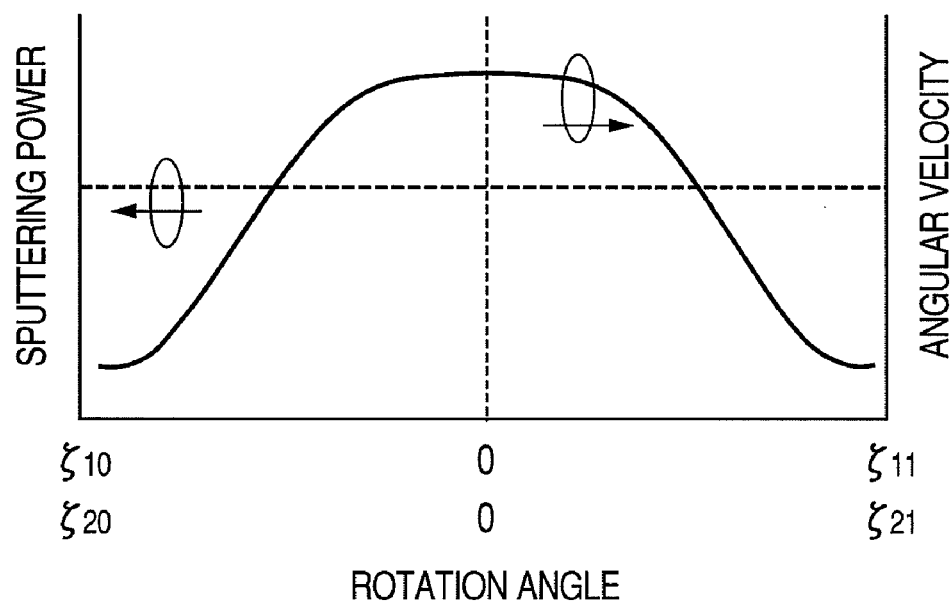
FIG. 13B is a graph showing the change of the sputtering power and the angular velocity relative to the rotation angle of the stage and the cathode.

Meanwhile, for example as in FIG. 9B, in a state where the centerline $e_1$ of the stage 901 coincides with the centerline $e_2$ of the cathode 902 on the reference plane P, and the substrate 904 and the target 903 are in parallel with each other, the incident angle of sputtered particles 905 emitted from the target 902 to the substrate 904 inevitably becomes small, thereby causing the lowering of the uniaxial magnetic anisotropy of the film. Accordingly, a motion, which temporarily suppresses the film forming in the vicinity of the time point when the centerline $e_1$ of the stage 901 coincides with the centerline $e_2$ of the cathode 902 on the reference plane P by adjusting the sputtering power as in FIG. 13A or adjusting the stage rotation velocity and the cathode rotation angular velocity as in FIG. 13B, is necessary. FIGS. 13A and 13B show the result under such conditions that angles formed between the reference plane P and the centerlines $e_2$ and $e_1$ of the stage 901 and the cathode 902 are $\xi_{10}=\xi_{11}=\xi_{20}=\xi_{21}$, and that the angular velocity of the stage 901 and the cathode 902 are $\omega_1=\omega_2$. Under the condition, the surface of the target 903 and the surface of the substrate 904 become in a completely parallel state. Hereinafter, more specific description will be given. Firstly, the sputtering film forming process starts from a position where the cathode 902 inclines about the rotation axis B by an angle $\xi_{20}$ from the reference plane P to the right direction and the stage 901 inclines about the rotation axis A by an angle $\xi_{10}$ from the reference plane P to the left direction, and the cathode 902 starts to rotate at an angular velocity $\omega_2$, and the stage 901 starts to rotate at an angular velocity $\omega_1$ in the same rotation direction. Concurrently with the sputtering treatment by the target 903, the centerlines $e_1$ and $e_2$ of the cathode 902 and the stage 901 passes across the reference plane P at the same time, and at the time point when the cathode 902 arrives at a position inclining about the rotation axis B by an angle $\xi_{21}$ from the reference plane P to the left direction and the stage 901 arrives at a position inclining about the rotation axis A by an angle $\xi_{11}$ from the reference plane P to the right direction, both the cathode 902 and the stage 901 are stopped and the sputtering process terminates.

FIG. 13A is a graph showing the change of the sputtering power and the angular velocity relative to the rotation angle of the stage 901 and the cathode 902, when constituting so that the sputtering power has the minimum value when an angle formed between the reference plane P and the centerlines $e_2$ and $e_1$ of the cathode 902 and the stage 901 is in the vicinity of zero, and that the sputtering power has the maximum value when rotation start angles are $\xi_{10}$ and $\xi_{20}$ or rotation stop angles are $\xi_{11}$ and $\xi_{21}$, while keeping angular velocity $\omega_1$ and $\omega_2$ constant. The time point when the angle formed between the reference plane P and the centerlines $e_2$ and $e_1$ of the cathode 902 and the stage 901 is in the vicinity of zero means, in other words, the vicinity of the time point when the centerlines $e_1$ and $e_2$ of the cathode 902 and the stage 901 pass across the reference plane P at the same time. By employing such constitution, it becomes possible to suppress as far as possible the deposition of sputtered particles 905 having a small substrate incident angle on the substrate 904 in the state where the centerline $e_1$ of the stage 901 and the centerline $e_2$ of the cathode 902 coincide with each other on the reference plane P and the substrate 904 becomes parallel with the target 903, and thereby to enhance the uniaxial anisotropy.

In contrast, FIG. 13B is a graph showing the change of the sputtering power and the angular velocity relative to the rotation angle of the stage 901 and the cathode 902, when constituting so that the angular velocity has the maximum value when an angle formed between the reference plane P and the centerlines $e_2$ and $e_1$ of the cathode 902 and the stage 901 is in the vicinity of zero, and that the angular velocity has the minimum value when rotation start angles are $\xi_{10}$ and $\xi_{20}$ and rotation stop angles are $\xi_{11}$ and $\xi_{21}$, while keeping the sputtering power constant. By employing such constitution, it becomes possible to suppress as far as possible the deposition of sputtered particles 905 having a small substrate incident angle on the substrate 904 in the state where the centerline $e_1$ of the stage 901 and the centerline $e_2$ of the cathode 902 coincide with each other on the reference plane P and the substrate 904 becomes parallel with the target 903, and thereby to enhance the uniaxial anisotropy. In summary, by approximately adjusting the sputtering power, the rotation angular velocity of the stage and the cathode, a uniaxial magnetic anisotropy film that has high quality and is excellent in uniformity can be formed.

Figure 14A:
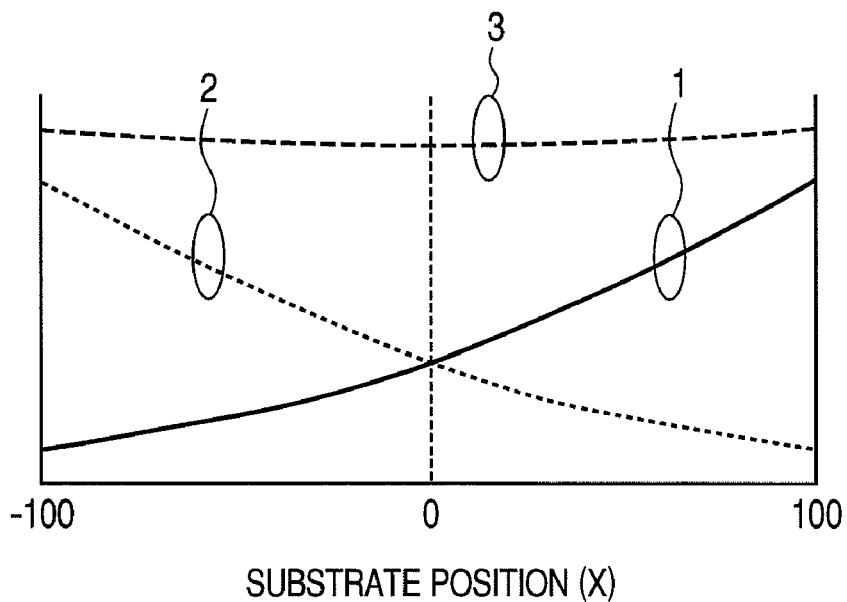
FIG. 14A is a diagram showing the film thickness distribution of a film formed on the substrate.
Figure 14B:
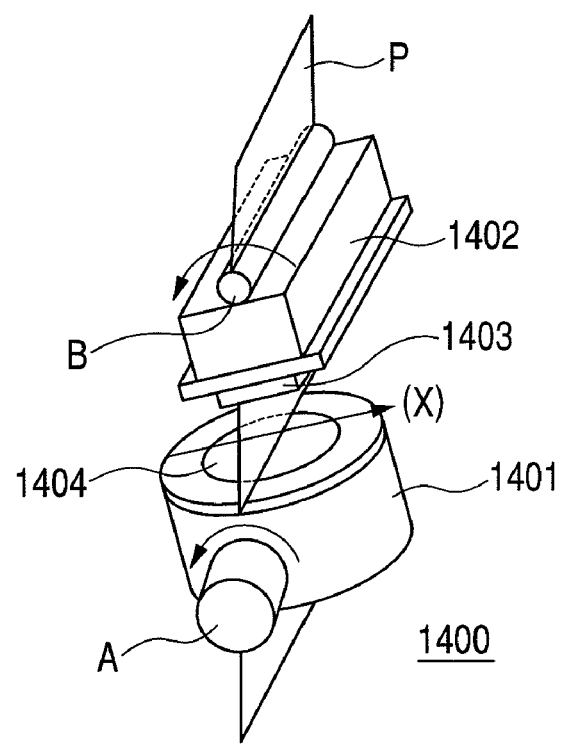
FIG. 14B is a perspective view of the first sputtering apparatus according to the present invention.

FIG. 14A is a diagram showing the thickness distribution of a film formed on the surface of a substrate 1404, when the substrate position (X mm) is set as a coordinate system in which the center of the substrate 1404 is set to zero and both ends of the substrate 1404 are set to −100 mm and +100 mm, respectively. FIG. 14B is a perspective view of the first sputtering apparatus according to the present invention drawn in FIGS. 9A and 9B, which clearly shows the substrate position (X mm) being the coordinate axis. A sputtering apparatus 1400 includes a stage 1401 for placing the substrate 1404, and a cathode 1402 for supporting a target 1403. The stage 1401 and the cathode 1402 are provided with the rotation axis A and the rotation axis B, respectively, and the stage 1401 and the cathode 1402 are constituted so as to rotate about the rotation axis A and the rotation axis B, respectively, at an arbitrary angle from the reference plane P. The rotation axis A and the rotation axis B are arranged in parallel with each other, and the target 1403 is supported by the cathode 1402 so as to be in parallel with the rotation axis B. The target 1403 supported by the cathode 1402 that is rotatable about the rotation axis B deposits sputtered particles on the substrate 1404 by colliding ions in plasma to the surface of the target 1403. The substrate 1404 subjected to the film forming treatment by the target 1403 is placed on the stage 1401 that is rotatable about the rotation axis A.

Figure 1:
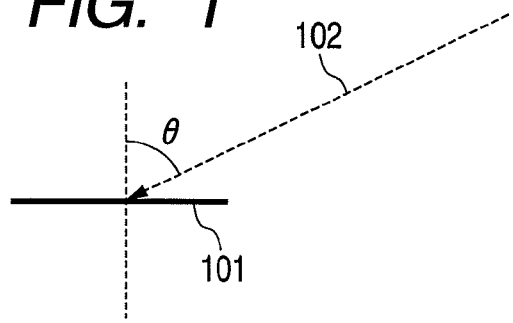
FIG. 1 is a diagram showing a situation of sputtered particles entering the substrate at a constant angle.
Figure 2:
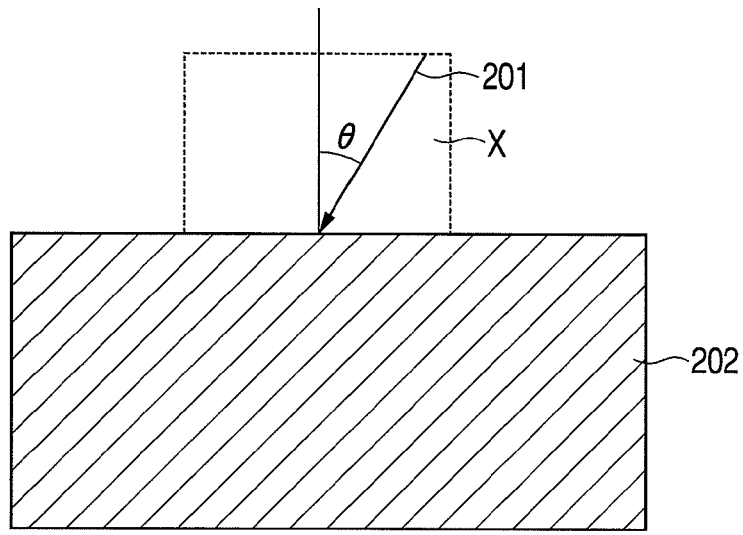
FIG. 2 is a diagram schematically showing a film structure obliquely grown by causing sputtered particles to enter obliquely at an incident angle θ.
Figure 3:
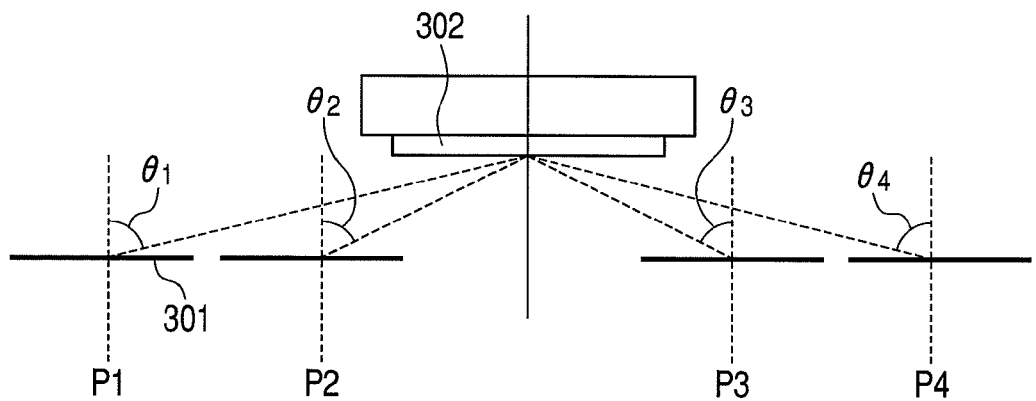
FIG. 3 is a diagram showing a passing type film forming structure of a prior art.

In FIG. 14A, 1) shows the thickness distribution of a film formed in a period in which an angle formed between the reference plane P and the centerline $e_1$ of the stage 1401 changes from $\xi_{10}$ to 0, 2) shows the thickness distribution of a film formed in a period in which an angle formed between the reference plane P and the centerline $e_1$ of the stage 1401 changes from 0 to $\xi_{11}$, and 3) shows the final thickness distribution of a film obtained as the result of processes 1) and 2). By setting $\xi_{10}=\xi_{11}$ and $\xi_{20}=\xi_{21}$, as shown in FIG. 14A, a distribution that is symmetrical relative to the substrate center can be obtained, which makes it easy to uniformize the film thickness distribution.

Figure 15A:
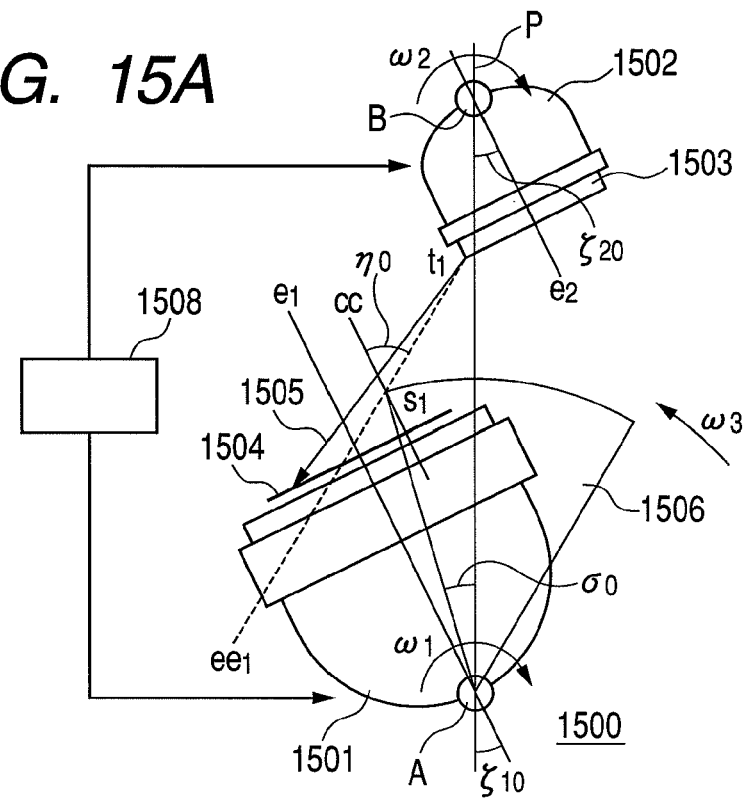
FIG. 15A is a diagram showing a film forming technique using the second sputtering apparatus according to the present invention.
Figure 15B:
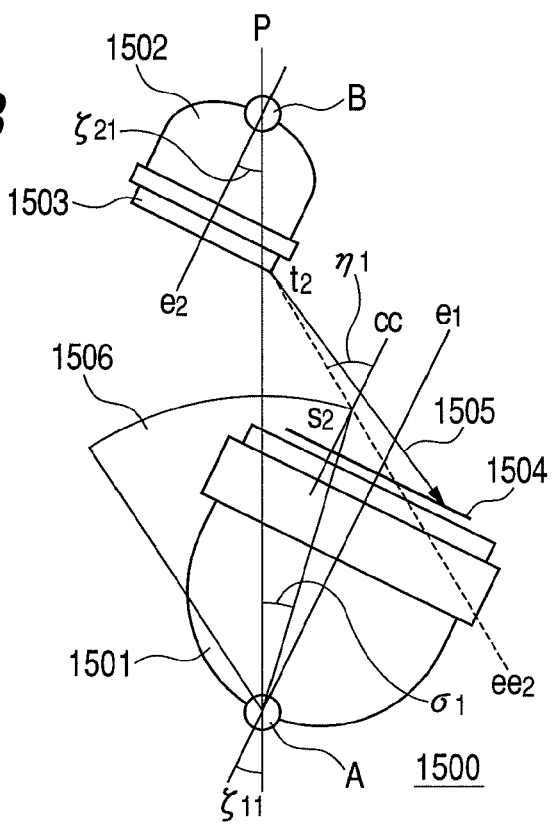
FIG. 15B is a diagram showing a film forming technique using the second sputtering apparatus according to the present invention.

FIGS. 15A and 15B show a deposition technique using the second sputtering apparatus according to the present invention shown in FIGS. 5A and 5B. A sputtering apparatus 1500 includes a stage 1501 for placing a substrate 1504, a cathode 1502 for supporting a target 1503, and a shield plate 1506. The stage 1501 and the cathode 1502 are provided with the rotation axis A and the rotation axis B, respectively, and the stage 1501 and the cathode 1502 are constituted so as to rotate about the rotation axis A and the rotation axis B, respectively, at an arbitrary angle from the reference plane P. For example, the stage 1501 and the cathode 1502 can be rotated using a rotation means such as a motor. Here, the reference plane P means a flat plane that passes across the rotation axis A and the rotation axis B, and extends in directions of respective rotation axes. The rotation axis A and the rotation axis B are arranged in parallel with each other, and the target 1503 is supported by the cathode 1502 so as to become parallel with the rotation axis B. The target 1503, which is supported by the cathode 1502 that is rotatable about the rotation axis B at an arbitrary angle, can deposit sputtered particles 1505 on the substrate 1504 by colliding ions in plasma to the surface of the target 1503 in each case of standing still and being rotated. The substrate 1504, which is subjected to a film forming treatment by the target 1503, is placed on the stage 1501 that is rotatable about the rotation axis A at an arbitrary angle. In addition, the shield plate 1506 is provided between the target 1503 and the stage 1501, and the shield plate 1506 has a means for rotating about either the rotation axis A or the rotation axis B at an arbitrary angle from the reference plane P, and fulfills functions of finely adjusting the thickness distribution of a film to be deposited and of enhancing the selectivity of the incident angle of sputtered particles 1505. The shield plate 1506 can rotate about the rotation axis A or the rotation axis B by an arbitrary method, and, in the embodiment, it is constituted so as to be rotatable about the rotation axis A. The shield plate 1506 can rotationally move independently from the cathode 1502 or the stage 1501. A series of rotational movement of the cathode 1502, the stage 1501 and the shield plate 1506 may be appropriately controlled by a control device 1508. The control device 1508 functions so as to control respective components of the sputtering apparatus, although it is not clearly shown in other diagrams.

In FIGS. 15A and 15B, the reference plane P shows a flat plane that passes across the rotation axis A and the rotation axis B and extends in the direction of respective rotation axes. $e_1$ shows the centerline of the stage 1501, and $e_2$ shows the centerline of the cathode 1502. cc shows the normal line of the substrate 1504. $ee_1$ is a straight line that connects an end portion $t_1$ of the target 1503 and an end portion $s_1$ of the shield plate 1506. $ee_2$ is a straight line that connects an end portion $t_2$ of the target 1503 and an end portion $s_2$ of the shield plate 1506. $\xi_{10}$ and $\xi_{11}$ are angles formed between the reference plane P and the centerline $e_1$ of the stage 1501. $\xi_{10}$ is the angle at the rotation start of the stage 1501, and $\xi_{11}$ is the angle at the rotation end of the stage 1501. $\xi_{20}$ and $\xi_{21}$ are angles formed between the reference plane P and the centerline $e_2$ of the cathode 1502. $\xi_{20}$ is the angle at the rotation start of the cathode 1502, and $\xi_{21}$ is the angle at the rotation end of the cathode 1502. $\sigma_0$ is a deflection angle of the straight line that connects the end portion $s_1$ of the shield plate 1506 and the rotation axis A of the stage 1501 from the reference plane P, and $\sigma_1$ is a deflection angle of the straight line that connects the end portion $s_2$ of the shield plate 1506 and the rotation axis A of the stage 1501 from the reference plane P. $\eta_0$ is an angle formed between the straight line $ee_1$ and the straight line cc. $\eta_1$ is an angle formed between the straight line $ee_2$ and the straight line cc. The cathode 1502 is constituted to be rotatable about the rotation axis B at the angular velocity $\omega_2$, and the stage 1501 is constituted to be rotatable about the rotation axis A at the angular velocity $\omega_1$. The shield plate 1506 is constituted to be rotatable at the angular velocity $\omega_3$ in the direction opposite to the rotation direction of the stage 1501 and the cathode 1502. Meanwhile, the aforementioned definition can be also used for the description about FIGS. 16 to 23.

As shown in FIG. 15A, at the start of sputtering, the cathode 1502 is in a state of inclining about the rotation axis B by the angle $\xi_{20}$ from the reference plane P to the right direction, and the stage 1501 is in a state of inclining about the rotation axis A by the angle $\xi_{10}$ from the reference plane P to the left direction. The angle formed between the line $ee_1$ connecting the end portion $t_1$ of the target 1503 and the end portion $s_1$ of the shield plate 1506 and the normal line cc of the substrate surface is the substrate incident angle $\eta_0$ of sputtered particles 1505, and the deflection angle of the straight line connecting the end portion $s_1$ of the shield plate 1506 and the rotation axis A of the stage 1501 from the reference plane P at this time is $\eta_0$. When starting a sputtering film forming process, the cathode 1502 rotates at the angular velocity $\omega_2$ and the stage 1501 rotates at the angular velocity $\omega_1$ in the same rotation direction, and, on the other hand, the shield plate 1506 rotates at the angular velocity $\omega_3$ in the rotation direction opposite to that of the cathode 1502 and stage 1501. After that, as shown in FIG. 15B, at the time point when the cathode 1502 inclines about the rotation axis B by the angle $\xi_{21}$ from the reference plane P to the left direction and the stage 1501 inclines about the rotation axis A by the angle $\xi_{11}$ from the reference plane P to the right direction, both the cathode 1502 and the stage 1501 are stopped, and the sputtering process also terminates. At the end of the sputtering, the angle formed between the line $ee_2$ connecting the end portion $t_2$ of the target 1503 and the end portion $s_2$ of the shield plate 1506 and the normal line cc of the substrate surface is the substrate incident angle $\eta_1$ of sputtered particles 1505, and the deflection angle of the straight line connecting the end portion $s_2$ of the shield plate 1506 and the rotation axis A of the stage 1501 from the reference plane P is $\sigma_1$.

Figure 15C:
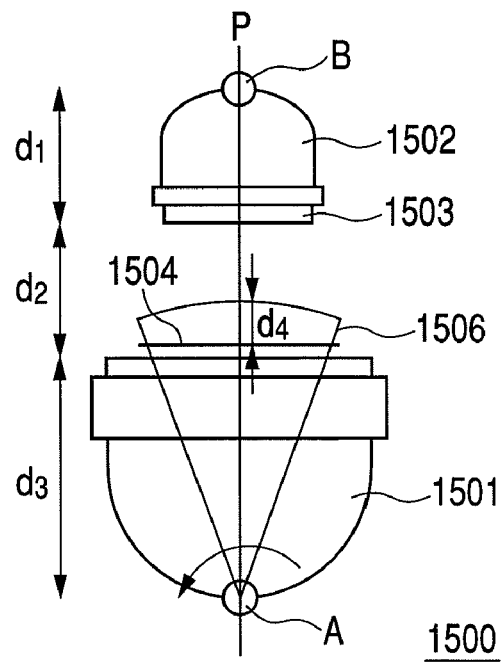
FIG. 15C is a side view of the second sputtering apparatus according to the present invention.
Figure 15D:
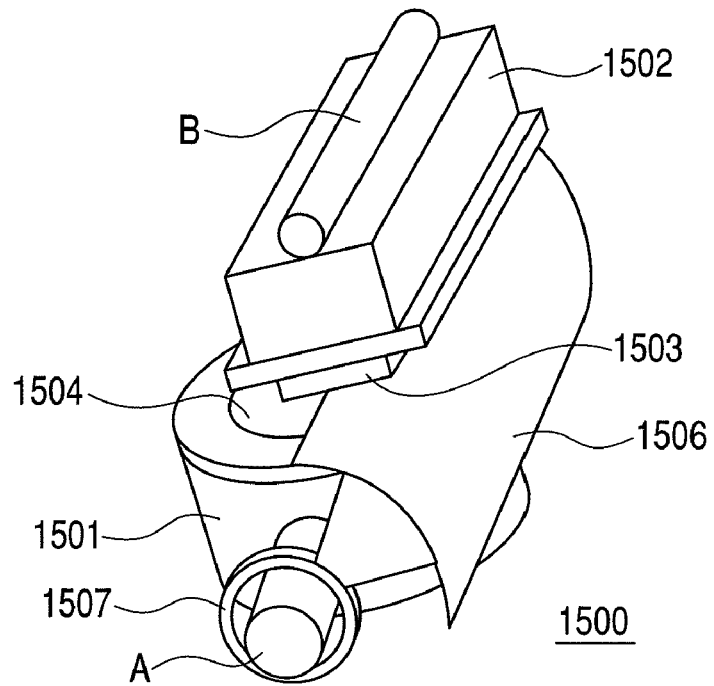
FIG. 15D is a perspective view of the second sputtering apparatus according to the present invention.

FIGS. 15C and 15D are diagrams showing more clearly the positional relation of respective components for the sputtering apparatus 1500 shown in FIGS. 15A and 15B. FIG. 15C shows an arrangement state in which the target 1503 and the substrate 1504 directly face straight in front of each other and centerlines $e_1$ and $e_2$ lie on the reference plane P. When the cathode 1502 and the stage 1501 stand while facing straight in front of each other, the surface of the target 1503 supported by the cathode 1502 and the surface of the substrate 1504 placed on the stage 1501 are in parallel with each other, and are in perpendicular to the reference plane P. When referring to FIG.

15C, $d_1$ denotes the distance from the rotation axis B to the surface of the target 1503, $d_2$ denotes the distance from the surface of the target 1503 to the surface of the substrate 1504, $d_3$ denotes the distance from the rotation axis A to the surface of the substrate 1504, and $d_4$ denotes the distance between the shield plate 1506 and the substrate 1504 on the reference plane P. When referring to FIG. 15D, it is understood that a rotation means 1507 for the shield plate is provided so as to surround the rotation axis A, in addition to respective components 1501 to 1506 of the sputtering apparatus 1500 of the present invention. The shield plate 1506 rotates about the rotation axis A by the rotation means 1507 for the shield plate, independently from the cathode 1502 or the stage 1501.

In FIGS. 15C and 15D, the distance $d_1$ between the rotation axis A and the surface of the target 1503 is 160 mm, the distance $d_2$ between the surface of the target 1503 and the surface of the substrate 1504 is 100 mm, and the distance $d_3$ between the rotation axis A and the surface of the substrate 1504 is 300 mm. The material of the target 1503 is NiFe, which has a size of 130 mm×450 mm and a thickness of 5 mm. The size of the substrate 1504 is 200 mm in diameter. The thickness of the shield plate 1506 is 3 mm. The distance $d_4$ between the shield plate 1506 and the substrate 1504 on the reference plane P is 50 mm. The rotation was performed so that an incident angle η of sputtered particles 1505 constantly became 50°. At this time, as the distribution of the film thickness (range/average×100) of 2% was obtained.

Figure 16A:
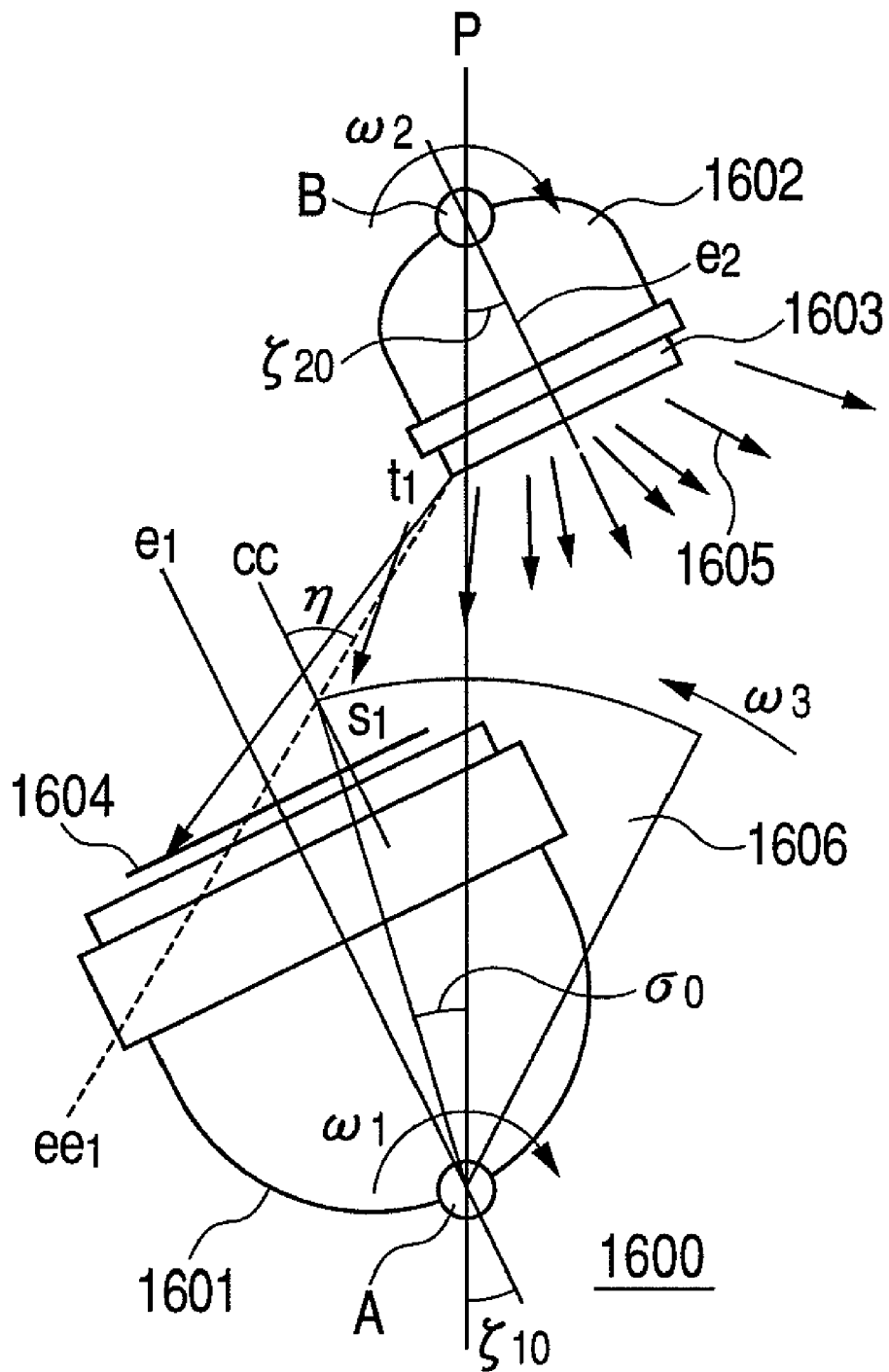
FIG. 16A is a diagram showing a state at the start of sputtering in an embodiment of the second sputtering apparatus according to the present invention.
Figure 16B:
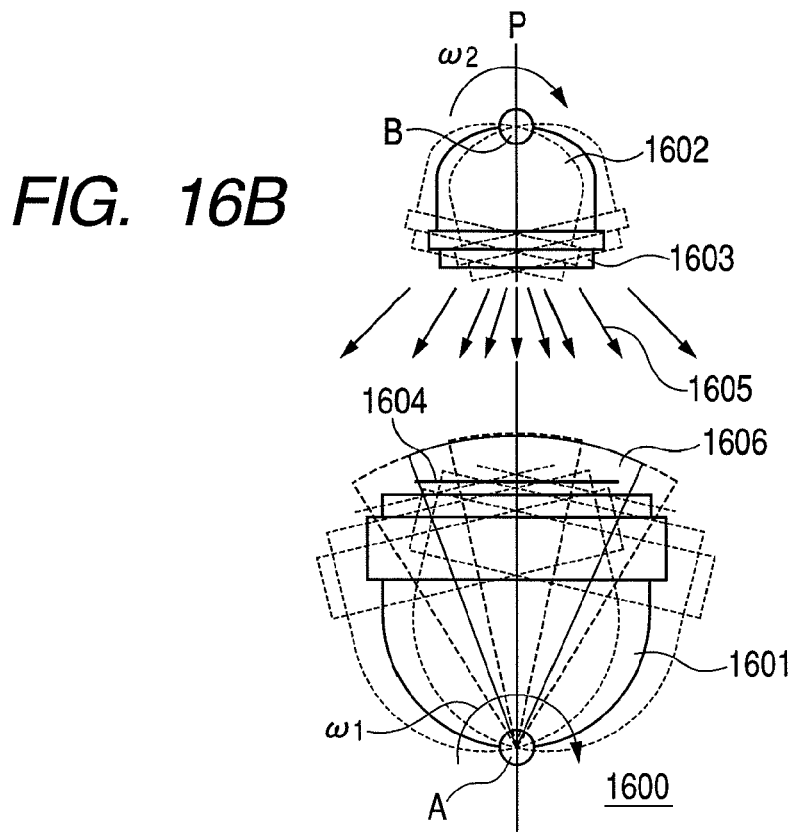
FIG. 16B is a diagram showing a state in the middle of sputtering in an embodiment of the second sputtering apparatus according to the present invention.
Figure 16C:
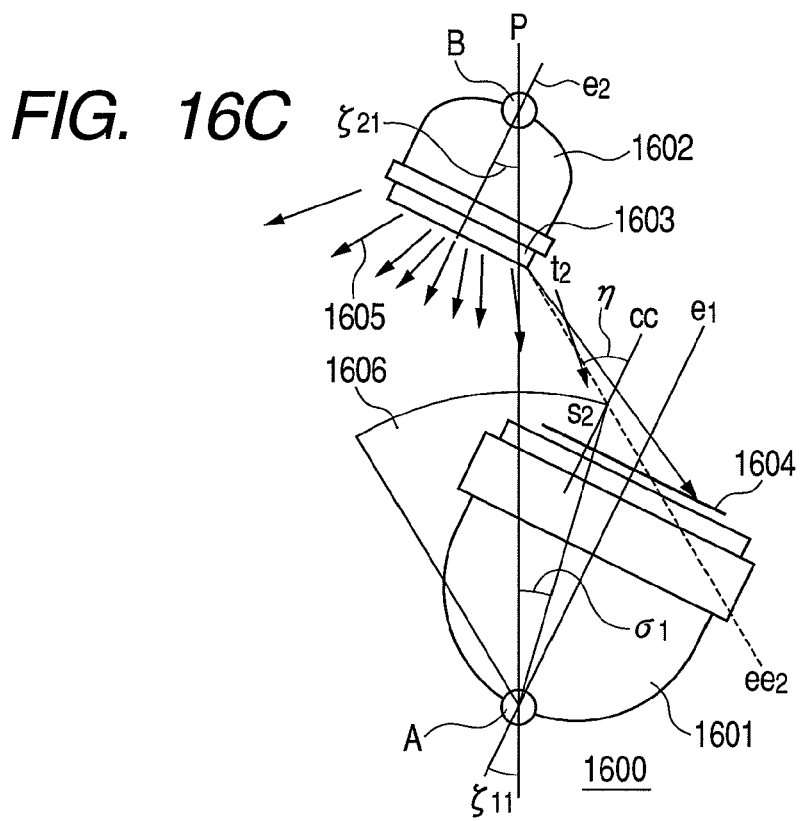
FIG. 16C is a diagram showing a state at the end of sputtering in an embodiment of the second sputtering apparatus according to the present invention.

FIGS. 16A to 16C are diagrams showing an embodiment of the second sputtering apparatus according to the present invention shown in FIGS. 5A and 5B. The basic structure of a sputtering apparatus 1600 is the same as that of the sputtering apparatus 1500 shown in FIGS. 15A to 15D. The embodiment was constituted so that the angle of the rotation start $ξ_{10}$ and $ξ_{20}$, and the angle of the rotation end $ξ_{11}$ and $ξ_{21}$ of the stage 1601 and the cathode 1602 were $ξ_{10}=ξ_{11}$ and $ξ_{20}=ξ_{21}$, that the stage 1601 and the cathode 1602 rotated about the rotation axis A and the rotation axis B, respectively, in the same direction so as to satisfy the angular velocity relation $ω_2/ω_1=ξ_{20}/ξ_{10}$ that allowed the centerlines $e_1$ and $e_2$ of the stage 1601 and the cathode 1602 to pass across the reference plane P at the same time, and that the shield plate 1606 rotated about the rotation axis A at the angular velocity $ω_3$ in the rotation direction opposite to the rotation direction of the cathode 1602 and the stage 1601 to constantly give a predetermined angle to the incident angle η of sputtered particles 1605.

FIG. 16A shows the state of respective components at the start of sputtering. The sputtering film forming process starts from a position in which the cathode 1602 inclines about the rotation axis B by the angle $ξ_{20}$ from the reference plane P to the right direction, and the stage 1601 inclines about the rotation axis A by the angle $ξ_{10}$ from the reference plane P to the left direction, and the cathode 1602 starts rotation at the angular velocity $ω_2$ and the stage 1601 starts rotation at the angular velocity $ω_1$ in the same rotation direction. On the stage 1601, the substrate 1604 is placed, and the substrate 1604 is subjected to a sputtering treatment by the target 1603. The shield plate 1606 is constituted so as to rotate about the rotation axis A at the angular velocity $ω_3$ in the direction opposite to the rotation direction of the cathode 1602 and the stage 1601. In FIG. 16A, an angle formed between the straight line $ee_1$ connecting the end portion $t_1$ of the target 1603 and the end portion $s_1$ of the shield plate 1606 and the normal line cc of the substrate surface at the start of the rotation is the angle η, and the deflection angle of the straight line connecting the end portion $s_1$ of the shield plate 1606 and the rotation axis A of the stage 1601 from the reference plane P is $σ_0$.

FIG. 16B shows a state of the stage 1601 and the cathode 1602 during sputtering, and shows a situation when the centerlines $e_1$ and $e_2$ of the stage 1601 and the cathode 1602 pass across the reference plane P at the same time. The shield plate 1606 rotationally moves at the angular velocity $ω_3$ according to the rotational movement of the cathode 1602 and the stage 1601 so that the incident angle η of sputtered particles 1605 constantly becomes a predetermined angle. As shown in FIG. 16B, it is also possible to appropriately adjust the $ω_3$ so as to completely shield the substrate 1604 from the target 1603 by the shield plate 1606 and not to allow sputtered particles 1605 to enter the substrate 1604. This makes it possible to suppress as far as possible the deposition of sputtered particles 1605 having a small substrate incident angle, and thereby to enhance the uniaxial magnetic anisotropy.

FIG. 16C shows a state of respective components at the end of sputtering. Both the cathode 1602 and the stage 1601 stop when the cathode 1602 inclines about the rotation axis B by the angle $ξ_{21}$ from the reference plane P to the left direction and the stage 1601 inclines about the rotation axis A by the angle $ξ_{11}$ from the reference plane P to the right direction, and the sputtering process terminates. An angle formed between a straight line $ee_2$ connecting the end portion $t_2$ of the target 1603 and the end portion $s_2$ of the shield plate 1606 and the normal line cc of the substrate surface is η, and the deflection angle at this time of a straight line connecting the end portion $s_2$ of the shield plate 1606 and the rotation axis A of the stage 1601 from the reference plane P is $σ_1$.

Figure 17A:
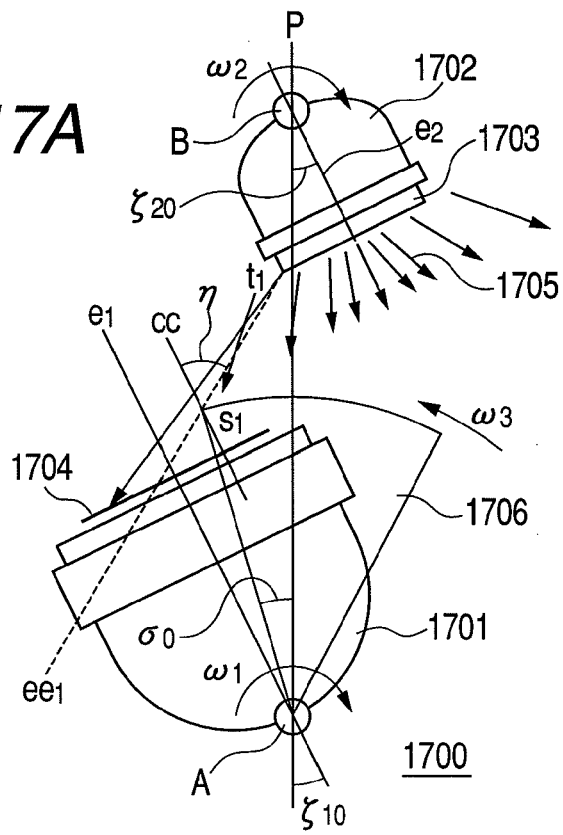
FIG. 17A is a diagram showing a state at the start of sputtering in an embodiment of the second sputtering apparatus according to the present invention.
Figure 17B:
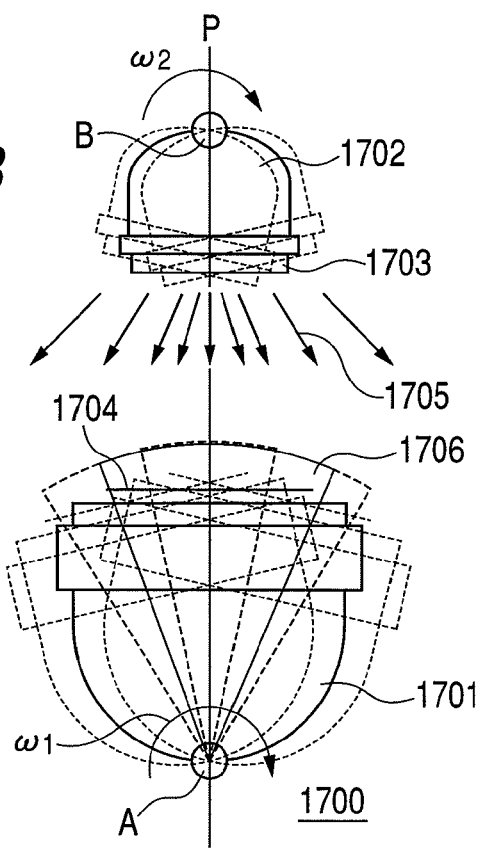
FIG. 17B is a diagram showing a state in the middle of sputtering in an embodiment of the second sputtering apparatus according to the present invention.
Figure 17C:
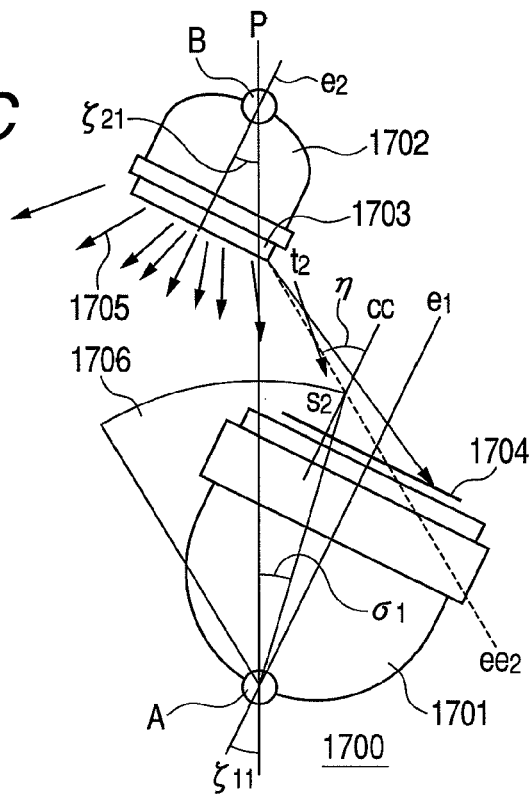
FIG. 17C is a diagram showing a state at the end of sputtering in an embodiment of the second sputtering apparatus according to the present invention.

FIGS. 17A to 17C are diagrams showing an embodiment of the second sputtering apparatus according to the present invention shown in FIGS. 5A and 5B. The basic structure of a sputtering apparatus 1700 is the same as that of the sputtering apparatus 1500 shown in FIGS. 15A to 15D. In the embodiment, the oblique film forming was carried out while setting the angle at the rotation start and the angle at the rotation end of the stage 1701 and the cathode 1702 to $ξ_{10}=ξ_{11}=ξ_{20}=ξ_{21}$, and setting the angular velocity of the cathode 1702 and the stage 1701 to $ω_1=ω_2$. In the embodiment, in any state in FIGS. 17A to 17C, the surface of the target 1703 and the surface of the substrate 1704 maintain a parallel state. Further, the shield plate 1706 was constituted so as to rotate in the direction opposite to the rotation direction of the cathode 1702 and the stage 1701 at the angular velocity $ω_3$ to constantly give a predetermined angle to the incident angle η of sputtered particles 1705.

FIG. 17A shows a situation in which a sputtering film forming process starts from a position where the cathode 1702 inclines about the rotation axis B by the angle $ξ_{20}$ from the reference plane P to the right direction and the stage 1701 inclines about the rotation axis A by the angle $ξ_{10}$ from the reference plane P to the left direction, and the cathode 1702 starts rotation at the angular velocity $ω_2$ and the stage 1701 starts rotation at the angular velocity $ω_1$ in the same direction. On the stage 1701, the substrate 1704 is placed. The shield plate 1706 is constituted so as to rotate about the rotation axis A at the angular velocity $ω_3$ in the direction opposite to the rotation direction of the cathode 1702 and the stage 1701. In FIG. 17A, an angle formed between the line $ee_1$ connecting the end portion $t_1$ of the target 1703 and the end portion $s_1$ of the shield plate 1706 and the normal line cc of the substrate surface is η, and the deflection angle at this time of a straight line connecting the end portion $s_1$ of the shield plate 1706 and the rotation axis A of the stage 1701 from the reference plane P is $σ_0$.

FIG. 17B shows a state of the stage 1701 and the cathode 1702 during sputtering, which shows a situation in which the centerlines $e_2$ and $e_1$ of the cathode 1702 and the stage 1701 pass across the reference plane P at the same time. The shield plate 1706 are rotating at the angular velocity $\omega_3$ according to the rotation of the cathode 1702 and the stage 1701 in the direction opposite to the cathode 1702 and the stage 1701 so that $\eta$ constantly becomes a predetermined angle. As shown in FIG. 17B, it is also possible to appropriately adjust the $\omega_3$ so as to completely shield the substrate 1704 from the target 1703 by the shield plate 1706, and not to allow sputtered particles 1705 to enter the substrate 1704.

FIG. 17C shows a situation in which both the cathode 1702 and the stage 1701 stop when the cathode 1702 arrives at a position inclining about the rotation axis B by the angle $\xi_{21}$ from the reference plane P to the left direction and the stage 1701 arrives at a position inclining about the rotation axis A by the angle $\xi_{11}$ from the reference plane P to the right direction, and the sputtering process terminates. An angle formed between the line $ee_2$ connecting the end portion $t_2$ of the target 1703 and the end portion $s_2$ of the shield plate 1706 and the normal line cc of the substrate surface is $\eta$, and the deflection angle of the straight line connecting the end portion $s_2$ of the shield plate 1706 and the rotation axis A of the stage 1701 from the reference plane P is $\sigma_1$.

Figure 18A:
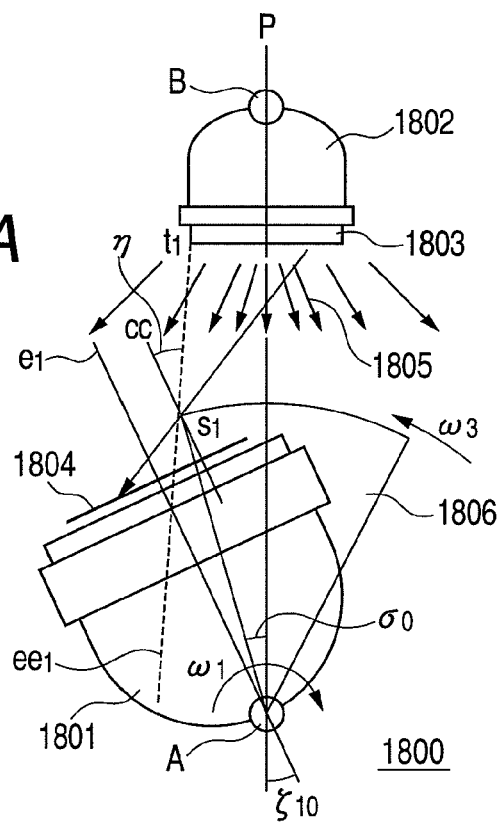
FIG. 18A is a diagram showing a state at the start of sputtering in an embodiment of the second sputtering apparatus according to the present invention.
Figure 18B:
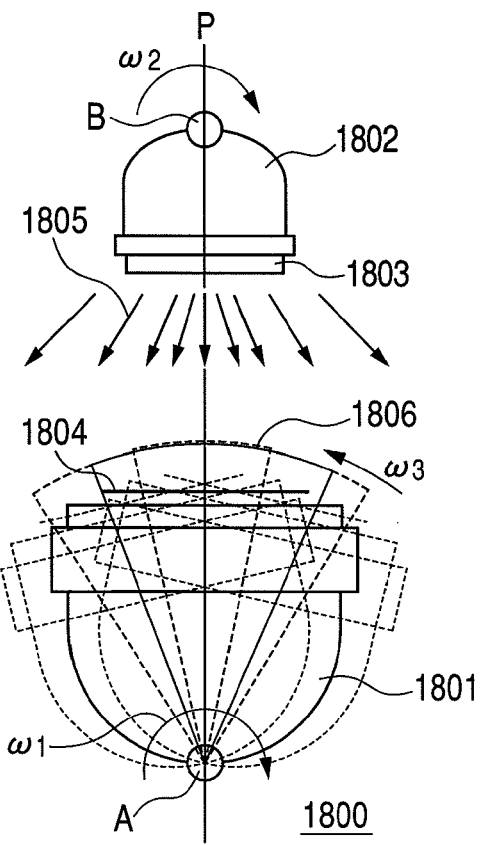
FIG. 18B is a diagram showing a state in the middle of sputtering in an embodiment of the second sputtering apparatus according to the present invention.
Figure 18C:
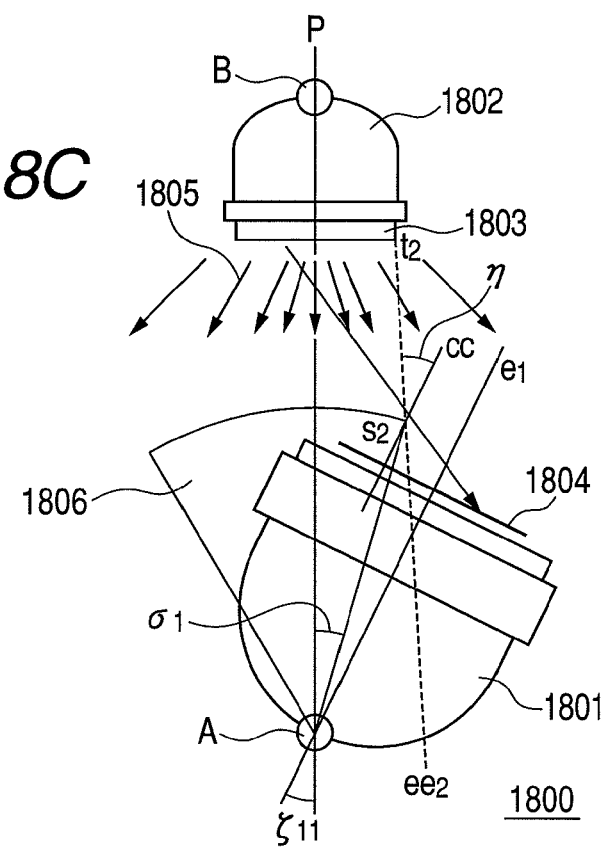
FIG. 18C is a diagram showing a state at the end of sputtering in an embodiment of the second sputtering apparatus according to the present invention.

FIGS. 18A to 18C are diagrams showing an embodiment of the second sputtering apparatus according to the present invention shown in FIGS. 5A and 5B. The basic structure of a sputtering apparatus 1800 is the same as that of the sputtering apparatus 1500 shown in FIGS. 15A to 15D. The embodiment was constituted so that the angle at the rotation start $\xi_{10}$ and $\xi_{20}$ and the angle at the rotation end $\xi_{11}$ and $\xi_{21}$ of a stage 1801 and a cathode 1802 were set to $\xi_{20}=\xi_{21}=0$ and $\xi_{10}=\xi_{11}\neq 0$ to rotate the stage 1801 alone being inclined, and that the shield plate 1806 was rotated at $\omega_3$ in the direction opposite to the rotation direction of the stage 1801 to constantly give a predetermined angle to $\eta$.

FIG. 18A shows the state of the stage 1801 and the cathode 1802 at the rotation start of the stage 1801. The stage 1801 is in a state of inclining about the rotation axis A by the angle $\xi_{10}$ from the reference plane P to the left direction. For the cathode 1802, the centerline $e_2$ thereof overlaps the reference plane P, and is not inclined from the reference plane P. In the present embodiment, the cathode 1802 is constituted so as not to rotate from the start of sputtering to the end of the sputtering, and the centerline $e_2$ never diverges from the reference plane P. The shield plate 1806 is constituted so as to rotate about the rotation axis A at the angular velocity $\omega_3$ in the direction opposite to the rotation direction of the stage 1801. In FIG. 18A, an angle formed between the straight line $ee_1$ connecting the end portion $t_1$ of the target 1803 and the end portion $s_1$ of the shield plate 1806 and the normal line cc of the substrate surface is $\eta$, and the deflection angle of the straight line connecting the end portion $s_1$ of the shield plate 1806 and the rotation axis A of the stage 1801 from the reference plane P is $\sigma_0$.

FIG. 18B shows a state of the stage 1801 and the cathode 1802 after starting the rotation and during sputtering, and a state in which the centerline $e_1$ of the stage 1801 coincides with the reference plane P. The shield plate 1806 rotates at the angular velocity $\omega_3$ in the direction opposite to the rotation direction of the stage 1801 according to the rotational movement of the stage 1801 so as to constantly give a predetermined angle to the incident angle $\eta$ of sputtered particles 1805. As shown in FIG. 18B, it is also possible to appropriately adjust the $\omega_3$ so as to completely shield the substrate 1804 from the target 1803 by the shield plate 1806 and not to allow sputtered particles 1805 to enter the substrate 1804.

FIG. 18C shows a state when the stage 1801 stops and the sputtering process terminates, wherein the stage 1801 stops when the stage 1801 arrives at a position inclining about the rotation axis A by the angle $\xi_{11}$ from the reference plane P to the right direction. An angle formed between the line $ee_1$ connecting the end portion $t_2$ of the target 1803 and the end portion $s_2$ of the shield plate 1806 and the normal line cc of the substrate surface is $\eta$, and the deflection angle of the straight line connecting the end portion $s_2$ of the shield plate 1806 and the rotation axis B of the stage 1801 from the reference plane P at this time is $\sigma_1$.

Figure 19A:
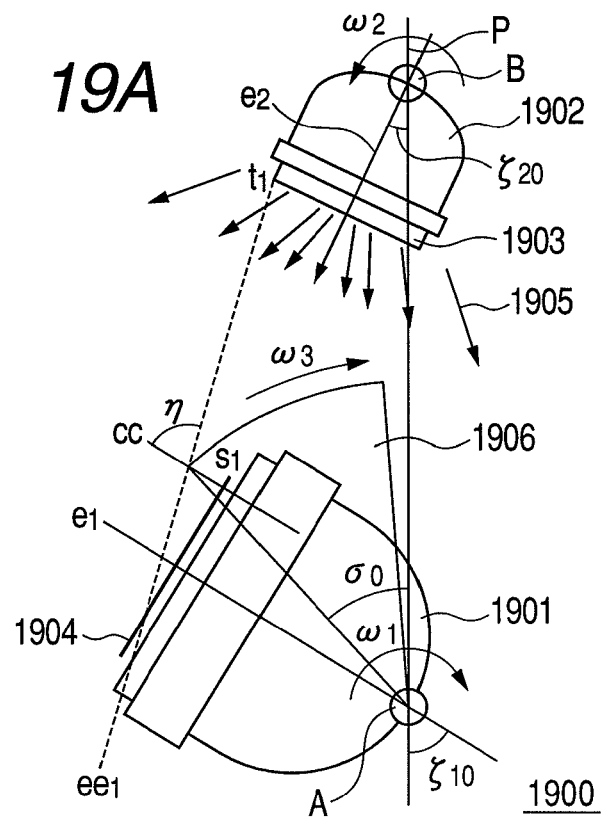
FIG. 19A is a diagram showing a state at the start of sputtering in an embodiment of the second sputtering apparatus according to the present invention.
Figure 19B:
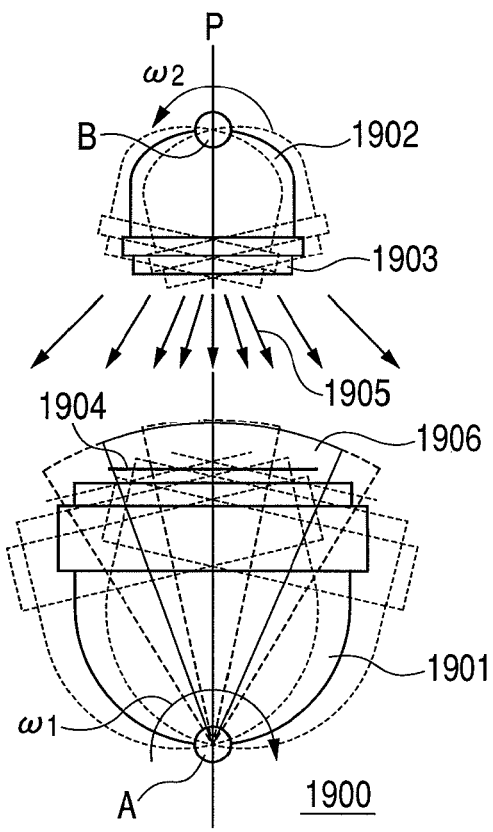
FIG. 19B is a diagram showing a state in the middle of sputtering in an embodiment of the second sputtering apparatus according to the present invention.
Figure 19C:
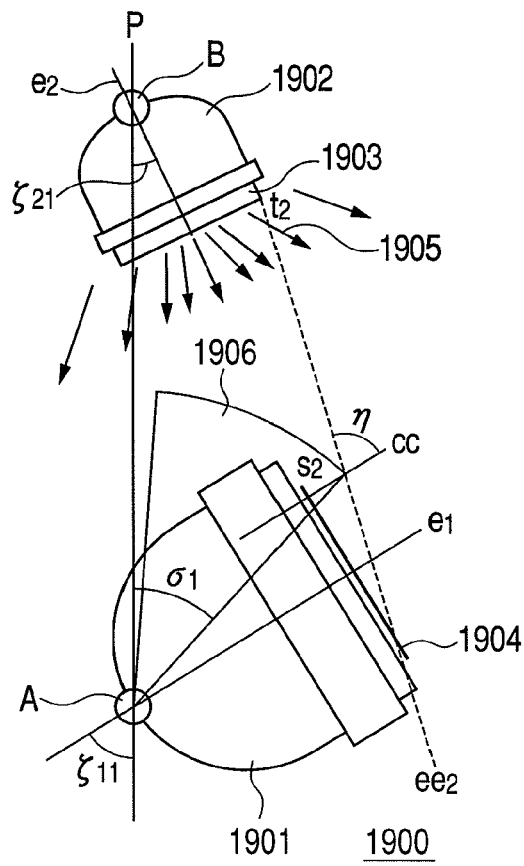
FIG. 19C is a diagram showing a state at the end of sputtering in an embodiment of the second sputtering apparatus according to the present invention.

FIGS. 19A to 19C are diagrams showing an embodiment of the second sputtering apparatus according to the present invention shown in FIGS. 5A and 5B. The basic structure of a sputtering apparatus 1900 is the same as that of the sputtering apparatus 1500 shown in FIGS. 15A to 15D. In the embodiment, angles at the rotation start $\xi_{10}$ and $\xi_{20}$ and angles at the rotation end $\xi_{11}$ and $\xi_{21}$ of the stage 1901 and the cathode 1902 were set to $\xi_{10}=\xi_{11}\neq 0$ and $\xi_{20}=\xi_{21}\neq 0$, and the stage 1901 and the cathode 1902 were constituted so as to be inclined in the same direction (in the embodiment, in the left direction of the reference plane P) and to start the rotation at angular velocities $\omega_1$ and $\omega_2$, respectively. In addition, the shield plate 1906 was constituted so as to rotate at the angular velocity $\omega_3$ in the same direction as the rotation direction of the stage 1901 to constantly give a predetermined angle to the incident angle $\eta$ of sputtered particles 1905.

FIG. 19A shows a situation in which a sputtering film forming process starts from a position wherein the cathode 1902 inclines about the rotation axis B by the angle $\xi_{20}$ from the reference plane P to the left direction and the stage 1901 inclines about the rotation axis A by the angle $\xi_{10}$ from the reference plane P to the left direction, the cathode 1902 rotates at the angular velocity $\omega_2$, and the stage 1901 rotates at the angular velocity $\omega_1$ in the rotation direction opposite to that of the cathode 1902. The shield plate 1906 is constituted so as to rotate about the rotation axis A at the angular velocity $\omega_3$ in the same direction as the rotation direction of the stage 1901. In FIG. 19A, an angle formed between the line $ee_1$ connecting the end portion $t_1$ of the target 1903 and the end portion $s_1$ of the shield plate 1906 and the normal line cc of the substrate surface is $\eta$, and the deflection angle of the straight line connecting the end portion $s_1$ of the shield plate 1906 and the rotation axis A of the stage 1901 from the reference plane P is $\sigma_0$. As is clear from FIG. 19A, by setting angles at the rotation start $\xi_{10}$ and $\xi_{20}$ of the stage 1901 and the cathode 1902 so as to give a state in which an angle formed between the surface of the target 1903 supported by the cathode 1902 and the surface of the substrate 1904 placed on the stage 1901 is approximately 90°, it is possible to make the incident angle of sputtered particles 1905 large.

FIG. 19B shows a state after starting the rotation of the stage 1901, the cathode 1902 and the shield plate 1906, and, in particular, a situation in which the centerlines $e_1$ and $e_2$ of the stage 1901 and the cathode 1902 pass across the reference plane P at the same time. At this time, the shield plate 1906 rotates at the angular velocity $\omega_3$, along with the rotation of the cathode 1902 and the stage 1901, in the same direction as that of the stage 1901 so as to constantly give a predetermined angle to the incident angle $\eta$ of sputtered particles 1905. As shown in FIG. 19B, it is also possible to appropriately adjust $\omega_3$ so that the substrate 1904 is completely shielded from the target 1903 by the shield plate 1906 when the centerlines $e_1$ and $e_2$ of the stage 1901 and the cathode 1902 pass across the reference plane P at the same time not to allow sputtered particles 1905 to enter the substrate 1904.

FIG. 19C shows a situation in which, at a position where the cathode 1902 inclines about the rotation axis B by the angle $\xi_{21}$ from the reference plane P to the right direction and the stage 1901 inclines about the rotation axis A by the angle $\xi_{11}$ from the reference plane P to the right direction, both the cathode 1902 and the stage 1901 stop and the sputtering process terminates. At this time, an angle formed between the line $ee_1$ connecting the end portion $t_2$ of the target 1903 and the end portion $s_2$ of the shield plate 1906 and the normal line cc of the substrate surface is $\eta$, and the deflection angle of the straight line connecting the end portion $s_2$ of the shield plate 1906 and rotation axis A of the stage 1901 from the reference plane P at this time is $\sigma_1$. As is clear from FIG. 19C, by setting angles at the rotation start $\xi_{11}$ and $\xi_{21}$ of the stage 1901 and the cathode 1902 so as to give a state in which an angle formed between the surface of the target 1903 supported by the cathode 1902 and the surface of the substrate 1904 placed on the stage 1901 is approximately 90°, it is possible to make the incident angle of sputtered particles 1905 large.

Figure 20A:
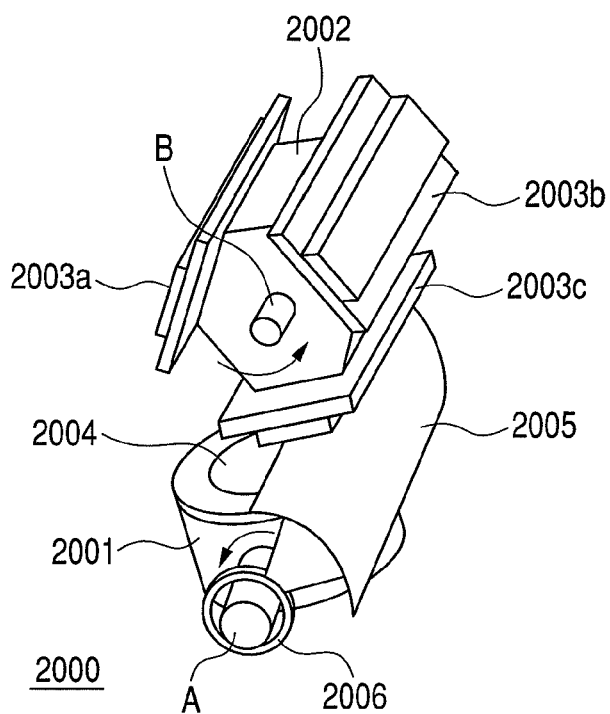
FIG. 20A is a diagram showing an embodiment of the second sputtering apparatus according to the present invention.

FIG. 20A is a diagram showing an embodiment of the second sputtering apparatus according to the present invention. A sputtering apparatus 2000 includes a stage 2001 for placing a substrate 2004, a cathode 2002 for supporting a target 2003, and a shield plate 2005. The stage 2001 and the cathode 2002 are provided with the rotation axis A and the rotation axis B, respectively, and the stage 2001 and the cathode 2002 are constituted so as to rotate about the rotation axis A and the rotation axis B, respectively, at an arbitrary angle from the reference plane P. For example, the stage 2001 and the cathode 2002 may be rotated using such a rotation means as a motor, and the rotation means may be controlled by a control device. The rotation axis A and the rotation axis B are arranged in parallel with each other, and the target 2003 is supported by the cathode 2002 so as to become parallel to the rotation axis B. The target 2003 supported by the cathode 2002 that is rotatable about the rotation axis B at an arbitrary angle, can deposit sputtered particles on the substrate 2004 by colliding ions in plasma to the surface of the target 2003 in each case of standing still and being rotated. The substrate 2004, which is subjected to a film forming treatment by the target 2003, is placed on the stage 2001 that is rotatable about the rotation axis A at an arbitrary angle. In addition, a shield plate 2005 is provided between the target 2003 and the stage 2001, wherein the shield plate 2005 has a means for rotating about the rotation axis A at an arbitrary angle from the reference plane P, and performs a function of finely adjusting the thickness distribution of a film to be deposited and a function of enhancing the selectivity of the incident angle of sputtered particles. The shield plate 2005 rotates about the rotation axis A independently from the cathode 2002 or the stage 2001 by appropriately controlling a rotation means 2006 for the shield plate by the control device.

Usually, a film having a heightened orientation is constituted of plural layers, and representative examples thereof include Ta/FeCo, NiFe/FeCo, and NiFeCr/FeCo. In order to produce such a film that is constituted of plural layers, plural targets 2003 are desirably supported by the cathode 2002. In the embodiment, there are plural targets 2003a, 2003b and 2003c, and the targets 2003a, 2003b and 2003c may be properly used according to applications appropriately. The rotation axis A and the rotation axis B are arranged in parallel with each other, and the targets 2003a, 2003b and 2003c are supported by the cathode 2002 so as to become parallel to the rotation axis B. The targets 2003a, 2003b and 2003c rotatable about the rotation axis B deposit sputtered particles on the substrate 2004 by colliding ions in plasma to the surface of the target 2003. Meanwhile, the rotational movement of the sputtering apparatus 2000 is the same as that described for FIGS. 16A to 19C.

Figure 20B:
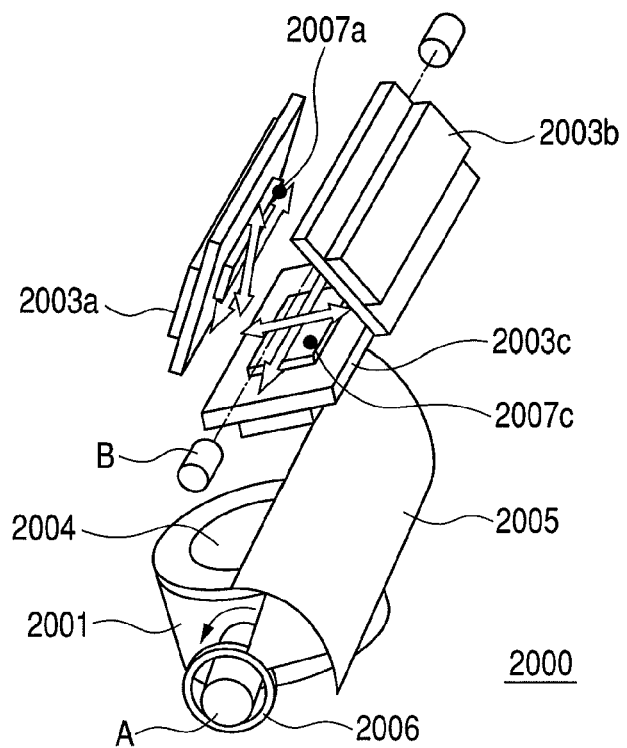
FIG. 20B is a diagram showing an embodiment of the second sputtering apparatus according to the present invention.

FIG. 20B is a diagram showing in more detail the inside of the targets 2003a, 2003b and 2003c supported by the cathode 2002 in FIG. 20A. FIG. 20B shows a situation in which oscillating magnetrons 2007a, 2007b and 2007c for a target arranged in respective insides of the plural targets 2003a, 2003b and 2003c are oscillated in order to improve the utilization efficiency of the target.

Figure 21A:
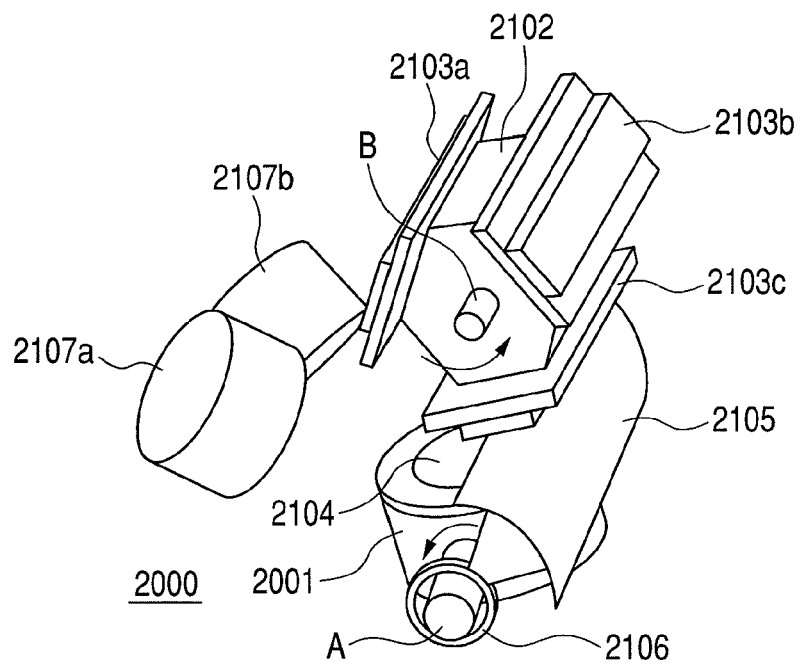
FIG. 21A is a diagram showing an embodiment of the second sputtering apparatus according to the present invention.
Figure 21B:
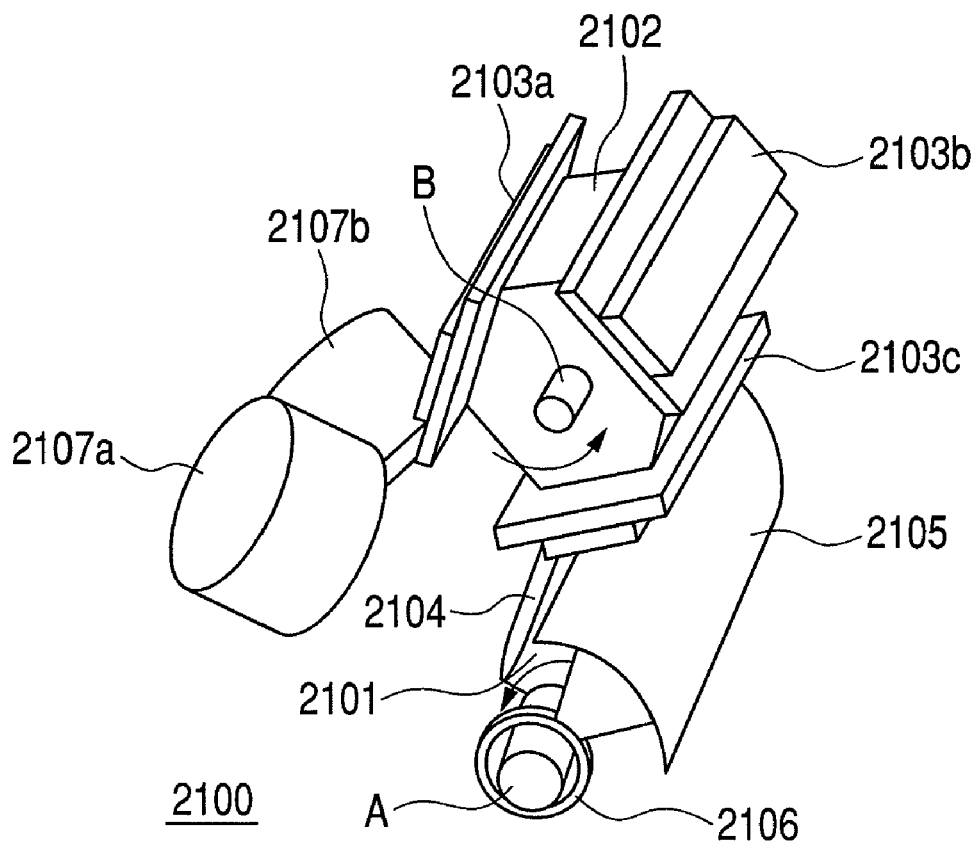
FIG. 21B is a diagram showing an embodiment of the second sputtering apparatus according to the present invention.

FIGS. 21A and 21B show an embodiment produced by combining a sputtering apparatus 2100 according to the present invention and a multi-source sputtering system 2107. The sputtering apparatus 2100 includes a stage 2101 for placing a substrate 2104, a cathode 2102 for supporting a target 2103, and a shield plate 2105. The target 2103 is constituted of multiple targets 2103a, 2103b and 2103c. The stage 2101 and the cathode 2102 are provided with the rotation axis A and the rotation axis B, respectively, and the stage 2101 and the cathode 2102 are constituted so as to rotate about the rotation axis A and the rotation axis B, respectively, at an arbitrary angle from the reference plane P. For example, the stage 2101 and the cathode 2102 may be rotated using such a rotation means as a motor, and the rotation means may be controlled by a control device. The rotation axis A and the rotation axis B are arranged in parallel with each other, and the target 2103 is supported by the cathode 2102 so as to become parallel to the rotation axis B. The target 2103 supported by the cathode 2102 that is rotatable about the rotation axis B at an arbitrary angle can deposit sputtered particles on the substrate 2104 by colliding ions in plasma to the surface of the target 2103 in each case of standing still and being rotated. The substrate 2104, which is subjected to a film forming treatment by the target 2103, is placed on the stage 2101 that is rotatable about the rotation axis A at an arbitrary angle. In addition, a shield plate 2105 is provided between the target 2103 and the stage 2101, and the shield plate 2105 rotates about the rotation axis A independently from the cathode 2102 or the stage 2101 by appropriately controlling a rotation means 2106 for the shield plate with a control device.

Figure 21C:
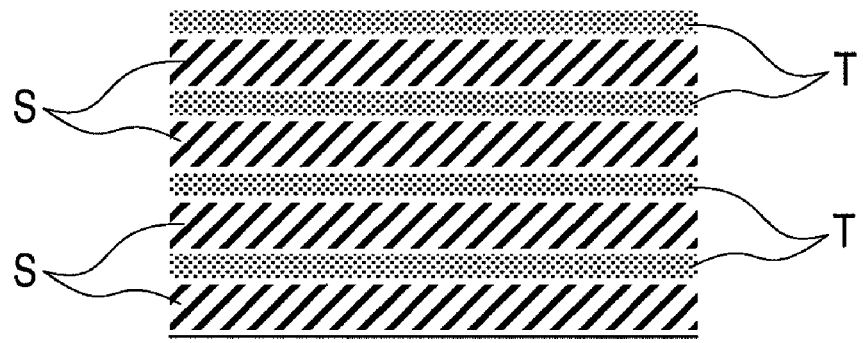
FIG. 21C is a diagram showing a laminated film formed by using the second sputtering apparatus according to the present invention.

In the embodiment, the multi-source sputtering system 2107 is constituted of two cathodes 2107a and 2107b, but more cathodes may also be incorporated according to applications. FIG. 21B shows a state in which, in an embodiment produced by combining the sputtering apparatus 2100 drawn in FIG. 21A and the multi-source sputtering system 2107 constituted of two cathodes 2107a and 2107b, the stage 2101 having the rotation axis A inclines to the multi-source sputtering system 2107 side. That is, in the state shown in FIG. 21A, oblique incidence sputtering by the cathode 2102 is possible, and, in the state shown in FIG. 21B, the film forming by the multi-source sputtering system 2107 is possible. By repeating these, it becomes possible to form a laminated film constituted of alternate layers such as an obliquely grown film S formed by the cathode 2102 and a film T formed by the multi-source sputtering system 2107, as shown in FIG. 21C. Particularly in these years, since writing heads adopt an antiparallel structure based on a multilayer film, the combination of the sputtering apparatus 2100 according to the present invention and the multi-source sputtering system 2107 is indispensable.

Figure 22:
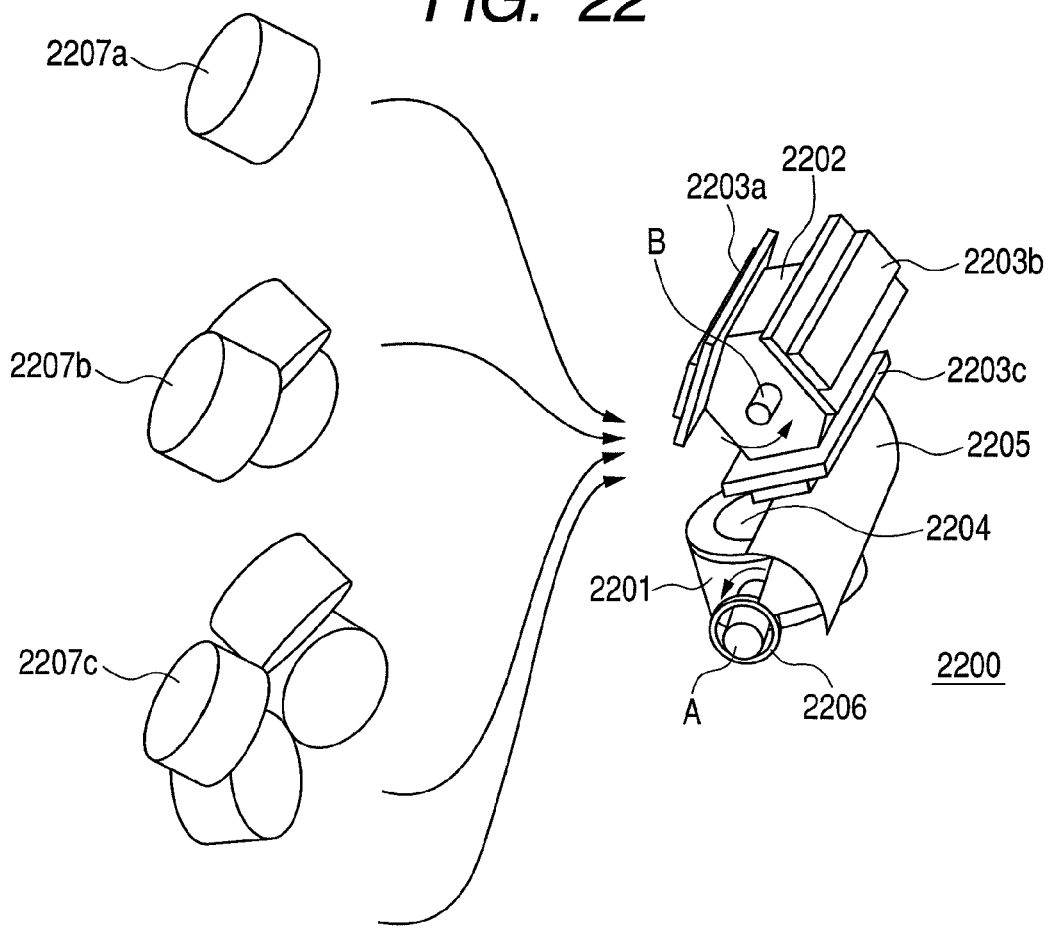
FIG. 22 is a diagram showing a combination of the second sputtering apparatus according to the present invention and a multi-source sputtering system.

FIG. 22 shows combinations of a sputtering apparatus 2200 according to the present invention and various types of multi-source sputtering systems 2207, specifically a 1-cathode unit 2207a, a 3-cathode unit 2207b, or a 4-cathode unit 2207c. The sputtering apparatus 2200 includes a stage 2201 for placing a substrate 2204, a cathode 2202 for supporting a target 2203, and a shield plate 2205. The target 2203 is constituted from multiple targets 2203a, 2203b and 2203c. The stage 2201 and the cathode 2202 are provided with the rotation axis A and the rotation axis B, respectively, and the stage 2201 and the cathode 2202 are constituted so as to rotate about the rotation axis A and the rotation axis B, respectively, at an arbitrary angle from the reference plane P. For example, the stage 2201 and the cathode 2202 may be rotated using such a rotation means as a motor, and the rotation means may be controlled by a control device. The rotation axis A and the rotation axis B are arranged in parallel with each other, and the target 2203 is supported by the cathode 2202 so as to become parallel to the rotation axis B. The target 2203 supported by the cathode 2202 that is rotatable about the rotation axis B at an arbitrary angle can deposit sputtered particles on the substrate 2204 by colliding ions in plasma to the surface of the target 2203 in each case of standing still and being rotated. The substrate 2204, which is subjected to a film forming treatment by the target 2203, is placed on the stage 2201 that is rotatable about the rotation axis A at an arbitrary angle. In addition, a shield plate 2205 is provided between the target 2203 and the stage 2201, wherein the shield plate 2205 rotates about the rotation axis A independently from the cathode 2202 or the stage 2201 by appropriately controlling a rotation means 2206 for the shield plate by a control device. By using the combination of the sputtering apparatus 2200 and the multi-source sputtering system 2207, specifically a 1-cathode unit 2207a, a 3-cathode unit 2207b or a 4-cathode unit 2207c, the usage application can further be extended.

Figure 23A:
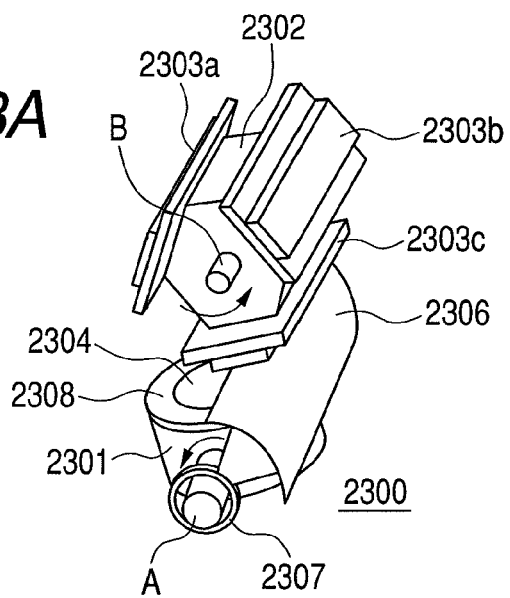
FIG. 23A is a perspective view of a third sputtering apparatus according to the present invention.
Figure 23B:
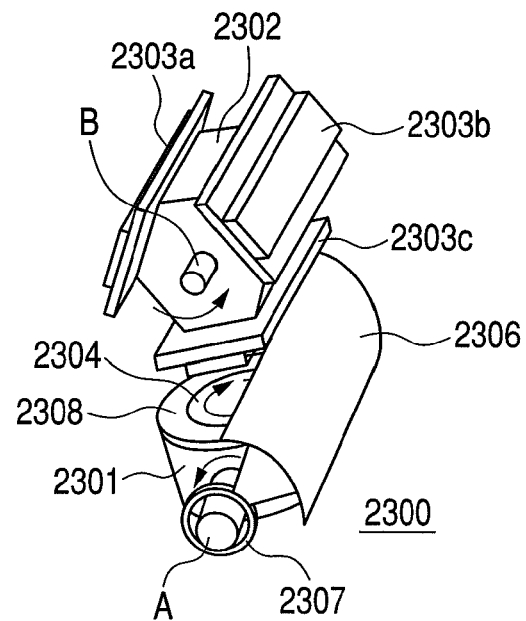
FIG. 23B is a perspective view of the third sputtering apparatus according to the present invention.
Figure 23C:
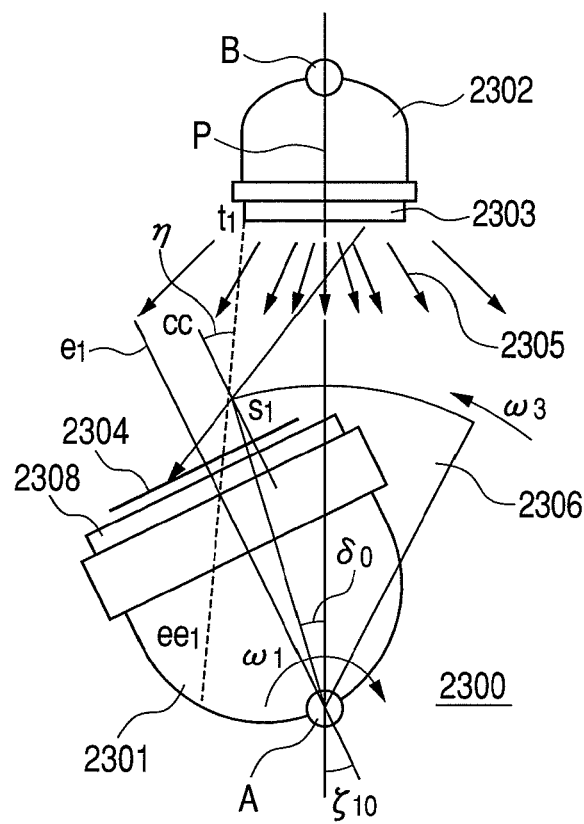
FIG. 23C is a diagram showing states at the start and at the end of sputtering in an embodiment of the third sputtering apparatus according to the present invention.

FIGS. 23A to 23D are diagrams showing a third sputtering apparatus using the stage 601 shown in FIGS. 6A and 6B. FIGS. 23A and 23C show a state when starting oblique sputtering by a sputtering apparatus according to the third embodiment of the present invention. FIG. 23A is a perspective view of aسputtering apparatus 2300 according to the third embodiment of the present invention. FIG. 23C is a side view of the sputtering apparatus 2300 according to the third embodiment of the present invention. Firstly, the constitution of the sputtering apparatus 2300 will be described using FIG. 23A. The sputtering apparatus 2300 includes a stage 2301 for placing a substrate 2304, a cathode 2302 for supporting a target 2303, and a shield plate 2306. The stage 2301 and the cathode 2302 are provided with the rotation axis A and the rotation axis B, respectively, and the stage 2301 and the cathode 2302 are constituted so as to rotate about the rotation axis A and the rotation axis B, respectively, at an arbitrary angle from the reference plane P. For example, the stage 2301 and the cathode 2302 may be rotated using such a rotation means as a motor, and the rotation means may be controlled by a control device. The rotation axis A and the rotation axis B are arranged in parallel with each other, and the target 2303 is supported by the cathode 2302 so as to become parallel to the rotation axis B. The target 2303 supported by the cathode 2302 that is rotatable about the rotation axis B at an arbitrary angle can deposit sputtered particles 2305 on the substrate 2304 by colliding ions in plasma to the surface of the target 2303 in each case of standing still and being rotated. The substrate 2304, which is subjected to a film forming treatment by the target 2303, is placed on a substrate placing table 2308 of the stage 2301. In addition, the shield plate 2306 is provided between the target 2303 and the stage 2301, and the shield plate 2306 is so constituted as rotatable about the rotation axis A at an arbitrary angle from the reference plane P, to perform a function of finely adjusting the thickness distribution of a film to be deposited and a function of enhancing the selectivity of the incident angle of sputtered particles 2305. The shield plate 2306 rotates about the rotation axis A independently from the cathode 2302 or the stage 2301 by appropriately controlling a rotation means 2307 for the shield plate by a control device.

In the embodiment, there are plural targets 2303a, 2303b and 2303c, and the targets 2303a, 2303b and 2303c may be properly used according to applications appropriately. The rotation axis A and the rotation axis B are arranged in parallel with each other, and the targets 2303a, 2303b and 2303c are supported by the cathode 2302 so as to become parallel to the rotation axis B. The targets 2303a, 2303b and 2303c rotatable about the rotation axis B deposit sputtered particles 2305 on the substrate 2304 by colliding ions in plasma to the surface of the target 2303.

FIG. 23C shows a state of the stage 2301 and the cathode 2302 at starting the rotation of the stage 2301. The sputtering film forming process starts from a position in which the stage 2301 inclines about the rotation axis A by the angle $\xi_{10}$ from the reference plane P to the left direction, and the stage 2301 starts to rotate at the angular velocity $\omega_1$. For the cathode 2302, the centerline $e_2$ thereof overlaps the reference plane P, and is not inclined from the reference plane P. In the embodiment, the cathode 2302 is constituted so as not to rotate from the start of sputtering to the end of the sputtering, and the centerline $e_2$ never diverges from the reference plane P. In FIG. 23C, an angle formed between the straight line $ee_1$ connecting the end portion $t_1$ of the target 2303 and the end portion $s_1$ of the shield plate 2306 and the normal line cc of the substrate surface is the incident angle $\eta$ of sputtered particles 2305 to the substrate 2304, and the deflection angle of the straight line connecting the end portion $s_1$ of the shield plate 2306 and the rotation axis A of the stage 2301 from the reference plane P at this time is $\sigma_0$. A substrate placing table 2308 of the stage 2301 has a rotation axis C that is perpendicular to the rotation axis A and passes through the center of the substrate 2304, and may rotate the substrate 2304 placed on the substrate placing table 2308 about the rotation axis C. The rotation of the substrate placing table 2308 is appropriately controlled by a control device. Such constitution was adopted that the sputtering film forming process was started, that the stage 2301 rotated in clockwise direction at the angular velocity $\omega_1$, and that the shield plate 2306 rotated in anticlockwise direction at $\omega_3$. Meanwhile, in the embodiment, the cathode 2302 is not rotated, but it is also possible to appropriately rotate it along with the rotation of the stage 2301 and the shield plate 2306.

Figure 23D:
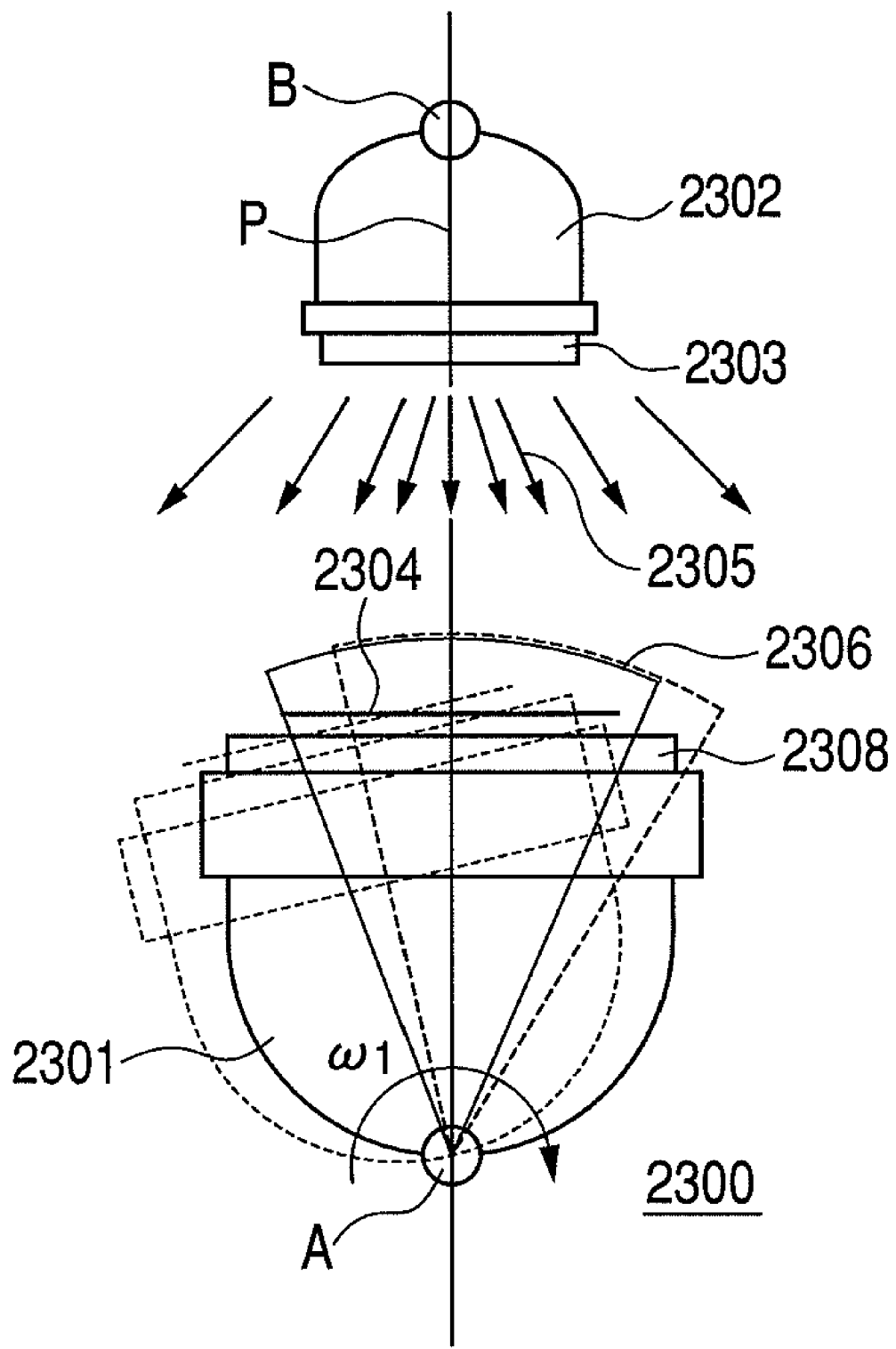
FIG. 23D is a diagram showing a state in the middle of sputtering in an embodiment of the third sputtering apparatus according to the present invention.

FIGS. 23B and 23D show a state in which the stage 2301 rotationally moved to make $\xi_{10}=0$, that is, the centerline $e_1$ of the stage 2301 coincided with the reference plane P. FIG. 23B shows a perspective view of the sputtering apparatus 2300 in the state in which the centerline $e_1$ of the stage 2301 coincides with the reference plane P, and FIG. 23D shows a side view in the state. At the time point when the centerline $e_1$ of the stage 2301 comes to coincide with the reference plane P, the substrate placing table 2308 of the stage 2301 rotates in 180° about the rotation axis C, which rotates the substrate 2304 in 180°. It is desirable to appropriately set the angular velocities $\omega_1$ and $\omega_3$ of the stage 2301 and shield plate 2306 so that the shield plate 2306 completely shields the substrate 2304 placed on the substrate placing table 2308 from sputtered particles 2305 emitted from the target 2303 at the time point when the centerline $e_1$ of the stage 2301 comes to coincide with the reference plane P. On this occasion, the rotation of the substrate 2304 is performed while being completely shielded from the sputtered particles 2305, thereby making it possible to enhance the uniaxial magnetic anisotropy of a thin film. After rotating the substrate 2304 in 180°, in the direction opposite to the aforementioned direction, that is, in anticlockwise direction, the stage 2301 starts to rotate at the angular velocity $\omega_1$ and the shield plate 2306 starts to rotate at the angular velocity $\omega_3$ in clockwise direction, to return to the state in FIGS. 23A and 23C, while performing sputtering concurrently. This method enables oblique incidence sputtering having a more narrowed moving range.

Aforementioned embodiments do not limit the scope of the present invention, and the embodiments may be appropriately changed to realize the subject content of the claim of the present invention on the basis of the teaching or suggestion of the embodiments.

What is claimed is:

1. An oblique sputtering apparatus comprising:
a cathode including a target supporting surface which supports a target of a sputtering material, the cathode being provided with a first rotation axis around which the target supporting surface rotates;
a stage including a substrate supporting surface, the stage being provided with a second rotation axis around which the substrate supporting surface rotates; and
a control device for controlling the rotation of the cathode and the stage, wherein:
the first rotation axis and the second rotation axis are arranged in parallel with each other, and the target supporting surface is supported by the cathode so as to become parallel to the first rotation axis;
the target supporting surface and the substrate supporting surface are arranged to face each other; and wherein
the control device controls the rotation of the cathode and the stage during sputtering so that the cathode and the stage respectively rotate in the same rotation direction and the target supporting surface and the substrate supporting surface move so as to pass each other while facing each other in parallel;
the control device controls the rotation of the cathode and the stage so that the rotation of the cathode is started from a position where the cathode inclines about the first rotation axis in a first direction with respect to a horizontal plane and is terminated at a position where the cathode inclines about the first rotation axis in a second direction with respect to the horizontal plane, and the rotation of the stage is started from a position where the stage inclines about the second rotation axis in the second direction with respect to the horizontal plane and is terminated at a position where the stage inclines about the second rotation axis in the first direction with respect to the horizontal plane; and
wherein angular velocities of the rotations of the cathode and the stage are maximized when the target supporting surface and the substrate supporting surface face each other in parallel, and the angular velocities of the rotations of the cathode and the stage are minimized when the rotation of the cathode and the stage is started or terminated.

2. A sputtering apparatus according to claim 1, wherein the rotation axis of the cathode and the rotation axis of the stage are aligned to be on the same reference plane.

3. A sputtering apparatus according to claim 1 further comprising a position adjustment mechanism for moving the cathode or/and the stage upward or downward so that the distance between the target supporting surface and the substrate supporting surface becomes constant during sputtering.

4. A sputtering apparatus according to claim 1, wherein the stage includes a substrate placing platform provided with a rotation axis perpendicular to the rotation axis of the stage, the top surface of the platform constituting the substrate supporting surface.

5. A sputtering apparatus according to claim 1 further comprising:
a shield plate provided between the target supporting surface and the substrate supporting surface; and
means for rotating the shield plate about the rotation axis of the stage and in a rotation direction opposite to the rotation direction of the stage.

6. A sputtering apparatus according to claim 1, wherein the cathode includes a plurality of target supporting surfaces, and the plurality of target supporting surfaces are arranged around the rotation axis of the cathode.

7. A method for producing a magnetic thin film having uniaxial magnetic anisotropy by an oblique sputtering comprising the steps of:
arranging sputtering magnetic material as a sputtering target on a target supporting surface of a cathode provided with a rotation axis around which the target supporting surface rotates;
arranging a substrate on a substrate supporting surface on a stage provided with a rotation axis around which the substrate supporting surface rotates; and
forming a magnetic thin film on the substrate while controlling the rotation of the cathode and the stage during sputtering so that the cathode and the stage respectively rotate in the same rotating directions and the target supporting surface and the substrate supporting surface move so as to pass each other while facing each other in parallel, wherein
the first rotation axis and the second rotation axis are arranged in parallel with each other, and the target supporting surface is supported by the cathode so as to become parallel to the first rotation axis;
the target supporting surface and the substrate supporting surface are arranged to face each other;
the rotation of the cathode and the stage are controlled so that the rotation of the cathode is started from a position where the cathode inclines about the first rotation axis in a first direction with respect to a horizontal plane and is terminated at a position where the cathode inclines about the first rotation axis in a second direction with respect to the horizontal plane, and the rotation of the stage is started from a position where the stage inclines about the second rotation axis in the second direction with respect to the horizontal plane and is terminated at a position where the stage inclines about the second rotation axis in the first direction with respect to the horizontal plane; and
a sputtering power is minimized when the target supporting surface and the substrate supporting surface face each other in parallel, and the sputtering power is maximized when the rotation of the cathode and the stage is started or terminated.

8. A method for producing a magnetic thin film according to claim 7, wherein the cathode or/and the stage are moved upward or downward so that the distance between the target supporting surface and the substrate supporting surface becomes constant during the sputtering.

9. A method for producing a magnetic thin film according to claim 7, wherein a shield plate provided between the target supporting surface and the substrate supporting surface is rotated about the rotation axis of the stage during the sputtering and in a rotation direction opposite to the rotation direction of the stage.

10. An oblique sputtering apparatus comprising:
a cathode including a target supporting surface which supports a target of a sputtering material, the cathode being provided with a rotation axis around which the target supporting surface rotates;
a stage including a substrate supporting surface, the stage being provided with a rotation axis around which the substrate supporting surface rotates; and
a control device for controlling the rotation of the cathode and the stage, wherein:
the target supporting surface and the substrate supporting surface are arranged to face each other; and
the control device controls the rotation of the cathode and the stage during sputtering so that the cathode and the stage respectively rotate in the same rotation direction and the target supporting surface and the substrate supporting surface move so as to pass each other while facing each other in parallel;
wherein the angular velocity of the rotation of either one of the cathode or the substrate or both of them is maximized when the target supporting surface and the substrate supporting surface face each other in parallel, while keeping a sputtering power constant.

11. A method of producing a magnetic thin film having uniaxial magnetic anisotropy by an oblique sputtering comprising the steps of:
arranging sputtering magnetic material as a sputtering target on a target supporting surface of a cathode provided with a rotation axis around which the target supporting surface rotates;
arranging a substrate on a substrate supporting surface on a stage provide with a rotation axis around which the substrate supporting surface rotates; and
forming a magnetic thin film on the substrate while controlling the rotation of the cathode and the stage during sputtering so that the cathode and the stage respectively rotate in the same rotating directions and the target supporting surface and the substrate supporting surface move so as to pass each other while facing each other in parallel,
wherein a sputtering power is minimized when the target supporting surface and the substrate supporting surface face each other in parallel, while keeping angular velocities of the rotations of the cathode and the stage constant.

* * * * *